(12) United States Patent
Morad et al.

(10) Patent No.: US 9,947,820 B2
(45) Date of Patent: Apr. 17, 2018

(54) SHINGLED SOLAR CELL PANEL EMPLOYING HIDDEN TAPS

(71) Applicant: SunPower Corporation, San Jose, CA (US)

(72) Inventors: Ratson Morad, Palo Alto, CA (US); Gilad Almogy, Palo Alto, CA (US); Itai Suez, Santa Cruz, CA (US); Jean Hummel, San Carlos, CA (US); Nathan Beckett, Oakland, CA (US); Yafu Lin, Santa Clara, CA (US); Dan Maydan, Los Altos Hills, CA (US); John Gannon, Oakland, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 14/674,983

(22) Filed: Mar. 31, 2015

(65) Prior Publication Data

US 2015/0349175 A1 Dec. 3, 2015

Related U.S. Application Data

(63) Continuation-in-part of application No. 14/530,405, filed on Oct. 31, 2014, now Pat. No. 9,780,253.
(Continued)

(51) Int. Cl.
*H01L 31/042* (2014.01)
*H01L 31/044* (2014.01)
(Continued)

(52) U.S. Cl.
CPC ...... *H01L 31/0508* (2013.01); *H01L 31/0201* (2013.01); *H01L 31/02002* (2013.01);
(Continued)

(58) Field of Classification Search
CPC ....... H02N 6/00; H01L 25/00; H01L 31/0504; H01L 31/0201; H01L 31/0527;
(Continued)

(56) References Cited

U.S. PATENT DOCUMENTS 2,938,938 A 5/1960 Dickson, Jr.
3,116,171 A 12/1963 Nielsen et al.
(Continued)

FOREIGN PATENT DOCUMENTS

DE 4017933 A1 12/1991
DE 4030713 A1 4/1992
(Continued)

OTHER PUBLICATIONS

R.A. Matula, Electrical Resistivity of Copper, Gold, Palladium, and Silver, Chem. Ref. Data, vol. 8, No. 4, 1979.*
(Continued)

*Primary Examiner* — Jeffrey T Barton
*Assistant Examiner* — Michael Y Sun
(74) *Attorney, Agent, or Firm* — Innovation Counsel LLP

(57) ABSTRACT

A high efficiency configuration for a solar cell module comprises solar cells arranged in a shingled manner to form super cells, which may be arranged to efficiently use the area of the solar module, reduce series resistance, and increase module efficiency. Each super cell comprises a plurality of rectangular or substantially rectangular silicon solar cells arranged in line with long sides of adjacent silicon solar cells overlapping and conductively bonded directly to each other to electrically connect the silicon solar cells in series. A super cell may comprise a hidden tap contact pad located on a back surface of a solar cell located at an intermediate position along the super cell. In some variations the overlapping sides of adjacent silicon soar cells in a super cell are
(Continued)

flexibly bonded to each other, and a flexible electrical interconnect is rigidly bonded to one of the solar cells.

7 Claims, 20 Drawing Sheets

Related U.S. Application Data

(60) Provisional application No. 62/064,834, filed on Oct. 16, 2014, provisional application No. 62/064,260, filed on Oct. 15, 2014, provisional application No. 62/048,858, filed on Sep. 11, 2014, provisional application No. 62/042,615, filed on Aug. 27, 2014, provisional application No. 62/036,215, filed on Aug. 12, 2014, provisional application No. 62/003,223, filed on May 27, 2014, provisional application No. 62/113,250, filed on Feb. 6, 2015, provisional application No. 62/081,200, filed on Nov. 18, 2014.

(51) Int. Cl.
| | |
|---|---|
| H01L 31/046 | (2014.01) |
| H01L 31/16 | (2006.01) |
| H01L 31/167 | (2006.01) |
| H01L 31/05 | (2014.01) |
| H01L 31/02 | (2006.01) |

(52) U.S. Cl.
CPC ...... *H01L 31/02013* (2013.01); *H01L 31/042* (2013.01); *H01L 31/044* (2014.12); *H01L 31/0504* (2013.01); *H01L 31/16* (2013.01); *H01L 31/167* (2013.01); *H01L 31/046* (2014.12); *Y02E 10/50* (2013.01)

(58) Field of Classification Search
CPC ... H01L 31/048; H01L 31/0508; H01L 31/05; H01L 31/044; H01L 31/042; H01L 31/02002; H01L 31/02013; H01L 31/167; H01L 31/16; H01L 31/046; Y02E 10/50; Y10T 428/3154

See application file for complete search history.

(56) References Cited

U.S. PATENT DOCUMENTS

| | | | |
|---|---|---|---|
| 3,340,096 A * | 9/1967 | Mann | H01L 31/0508 136/244 |
| 3,459,597 A | 8/1969 | Baron | |
| 3,769,091 A | 10/1973 | Leinkram et al. | |
| 3,811,181 A | 5/1974 | Leinkram et al. | |
| 3,837,924 A | 9/1974 | Baron | |
| 4,257,821 A | 3/1981 | Kelly et al. | |
| 4,617,420 A | 10/1986 | Dilts et al. | |
| 4,617,421 A | 10/1986 | Nath et al. | |
| 4,652,693 A | 3/1987 | Bar-On | |
| 4,805,006 A * | 2/1989 | Yamaguchi | H01L 27/14643 136/244 |
| 4,877,460 A | 10/1989 | Flodl | |
| 5,590,495 A | 1/1997 | Bressler et al. | |
| 6,018,123 A * | 1/2000 | Takada | F24J 2/045 136/248 |
| 6,034,322 A | 3/2000 | Pollard | |
| 6,180,868 B1 | 1/2001 | Yoshino et al. | |
| 6,232,545 B1 | 5/2001 | Samaras et al. | |
| 6,303,853 B1 | 10/2001 | Fraas et al. | |
| 6,315,575 B1 | 11/2001 | Kajimoto | |
| 6,353,175 B1 | 3/2002 | Fraas | |
| 6,414,235 B1 | 7/2002 | Luch | |
| 6,441,297 B1 | 8/2002 | Keller et al. | |
| 6,489,553 B1 | 12/2002 | Fraas et al. | |
| 6,525,262 B1 | 2/2003 | Makita et al. | |
| 6,538,193 B1 | 3/2003 | Fraas | |
| 6,563,289 B1 | 5/2003 | Cross | |
| 6,573,445 B1 | 6/2003 | Burgers | |
| 6,610,919 B2 | 8/2003 | Ohkubo | |
| 6,653,550 B2 | 11/2003 | Hayashi et al. | |
| 6,670,787 B2 | 12/2003 | Tachibana | |
| 6,770,544 B2 | 8/2004 | Sawada | |
| 6,803,513 B2 | 10/2004 | Beernink et al. | |
| 7,238,878 B2 | 7/2007 | Gonsiorawski | |
| 7,271,333 B2 | 9/2007 | Fabick et al. | |
| 7,388,146 B2 | 6/2008 | Fraas et al. | |
| 7,390,961 B2 | 6/2008 | Aschenbrenner et al. | |
| 7,507,903 B2 | 3/2009 | Luch | |
| 7,534,699 B2 | 5/2009 | Wong et al. | |
| 7,635,810 B2 | 12/2009 | Luch | |
| 7,772,484 B2 | 8/2010 | Li et al. | |
| 7,777,128 B2 | 8/2010 | Montello et al. | |
| 7,781,672 B2 | 8/2010 | Gaudiana et al. | |
| 7,825,329 B2 | 11/2010 | Basol | |
| 7,829,781 B2 | 11/2010 | Montello et al. | |
| 7,829,785 B2 | 11/2010 | Basol | |
| 7,851,700 B2 | 12/2010 | Luch | |
| 7,868,249 B2 | 1/2011 | Luch | |
| 7,872,192 B1 | 1/2011 | Fraas et al. | |
| 7,989,692 B2 | 8/2011 | Luch | |
| 7,989,693 B2 | 8/2011 | Luch | |
| 8,110,737 B2 | 2/2012 | Luch | |
| 8,138,413 B2 | 3/2012 | Luch et al. | |
| 8,207,440 B2 | 6/2012 | Basol | |
| 8,222,513 B2 | 7/2012 | Luch | |
| 8,304,646 B2 | 11/2012 | Luch | |
| 8,319,097 B2 | 11/2012 | Luch | |
| 8,334,451 B2 | 12/2012 | Polce et al. | |
| 8,378,209 B2 | 2/2013 | Masson et al. | |
| 8,574,943 B2 | 11/2013 | Murray et al. | |
| 8,586,875 B2 | 11/2013 | Morita et al. | |
| 8,729,385 B2 | 5/2014 | Luch | |
| 8,766,090 B2 | 7/2014 | Sewell et al. | |
| 2001/0054262 A1 | 12/2001 | Nath et al. | |
| 2003/0029494 A1 | 2/2003 | Ohkubo | |
| 2003/0121228 A1 | 7/2003 | Stoehr et al. | |
| 2004/0261836 A1 | 12/2004 | Kataoka et al. | |
| 2005/0126619 A1 | 6/2005 | Abe et al. | |
| 2005/0133079 A1 | 6/2005 | Boulanger et al. | |
| 2005/0217717 A1 | 10/2005 | Faris | |
| 2005/0263178 A1 | 12/2005 | Montello et al. | |
| 2007/0107766 A1 | 5/2007 | Langley, II et al. | |
| 2007/0283996 A1 | 12/2007 | Hachtmann et al. | |
| 2007/0283997 A1 | 12/2007 | Hachtmann et al. | |
| 2008/0156365 A1 | 7/2008 | Scholz et al. | |
| 2008/0216887 A1 | 9/2008 | Hacke et al. | |
| 2009/0014505 A1 | 1/2009 | Croft et al. | |
| 2009/0038671 A1 | 2/2009 | Yamaguchi | |
| 2009/0114279 A1 * | 5/2009 | Zhao | H02S 40/22 136/256 |
| 2010/0001587 A1 | 1/2010 | Casey et al. | |
| 2010/0012172 A1 | 1/2010 | Meakin et al. | |
| 2010/0043863 A1 | 2/2010 | Wudu et al. | |
| 2010/0071752 A1 | 3/2010 | Vellore et al. | |
| 2010/0075151 A1 | 3/2010 | Weingord et al. | |
| 2010/0078057 A1 | 4/2010 | Karg et al. | |
| 2010/0078064 A1 | 4/2010 | Coakley | |
| 2010/0084004 A1 | 4/2010 | Ortabasi | |
| 2010/0131108 A1 | 5/2010 | Meyer | |
| 2010/0136748 A1 | 6/2010 | Autry | |
| 2010/0139734 A1 | 6/2010 | Hadar et al. | |
| 2010/0147364 A1 | 6/2010 | Gonzalez et al. | |
| 2010/0218799 A1 | 9/2010 | Stefani | |
| 2010/0224230 A1 | 9/2010 | Luch et al. | |
| 2010/0243024 A1 | 9/2010 | Hashimoto et al. | |
| 2010/0308662 A1 | 12/2010 | Schatz et al. | |
| 2011/0005572 A1 | 1/2011 | Shimizu | |
| 2011/0048501 A1 | 3/2011 | Jaus et al. | |
| 2011/0079263 A1 | 4/2011 | Avrutsky | |
| 2011/0114158 A1 | 5/2011 | Lenox | |
| 2011/0155209 A1 | 6/2011 | Tober et al. | |
| 2011/0168237 A1 | 7/2011 | Takeda et al. | |
| 2011/0168238 A1 | 7/2011 | Metin et al. | |
| 2011/0192448 A1 | 8/2011 | Croft et al. | |
| 2011/0197947 A1 | 8/2011 | Croft | |

(56) References Cited

U.S. PATENT DOCUMENTS

| | | | |
|---|---|---|---|
| 2011/0214714 A1 | 9/2011 | Aberle et al. | |
| 2011/0240337 A1 | 10/2011 | Montello et al. | |
| 2011/0271999 A1 | 11/2011 | Almogy et al. | |
| 2011/0272004 A1 | 11/2011 | Davis et al. | |
| 2011/0315184 A1 | 12/2011 | Kabade | |
| 2012/0031457 A1 | 2/2012 | Taira et al. | |
| 2012/0037206 A1 | 2/2012 | Norman et al. | |
| 2012/0048349 A1 | 3/2012 | Metin et al. | |
| 2012/0118355 A1 | 5/2012 | Rudolfs | |
| 2012/0125391 A1* | 5/2012 | Pinarbasi | H01L 31/0504 136/244 |
| 2012/0152327 A1 | 6/2012 | Pinarbasi et al. | |
| 2012/0152349 A1 | 6/2012 | Cao et al. | |
| 2012/0234388 A1 | 9/2012 | Stancel et al. | |
| 2012/0244656 A1 | 9/2012 | Kim et al. | |
| 2012/0268087 A1 | 10/2012 | Kernahan | |
| 2012/0279548 A1 | 11/2012 | Munch et al. | |
| 2012/0318318 A1 | 12/2012 | Metin et al. | |
| 2012/0318319 A1* | 12/2012 | Pinarbasi | H01L 31/0504 136/244 |
| 2012/0325282 A1 | 12/2012 | Snow et al. | |
| 2013/0048046 A1 | 2/2013 | Domsic et al. | |
| 2013/0068279 A1 | 3/2013 | Buller et al. | |
| 2013/0096710 A1 | 4/2013 | Pinarbasi et al. | |
| 2013/0152996 A1* | 6/2013 | DeGroot | H01L 31/0508 136/244 |
| 2013/0160823 A1 | 6/2013 | Khouri et al. | |
| 2013/0160824 A1 | 6/2013 | Khouri et al. | |
| 2013/0206203 A1 | 8/2013 | Lommasson et al. | |
| 2013/0206206 A1 | 8/2013 | Bjorneklett et al. | |
| 2013/0206210 A1* | 8/2013 | Niinobe | H01L 31/048 136/246 |
| 2013/0206213 A1 | 8/2013 | He et al. | |
| 2013/0206221 A1 | 8/2013 | Gannon et al. | |
| 2014/0060610 A1 | 3/2014 | Moslehi et al. | |
| 2014/0102519 A1* | 4/2014 | Rodrigues | H01L 31/0428 136/251 |
| 2014/0116495 A1 | 5/2014 | Kim et al. | |
| 2014/0318613 A1 | 10/2014 | Von Campe et al. | |
| 2016/0158890 A1 | 6/2016 | Gonzalez et al. | |
| 2016/0163888 A1 | 6/2016 | Reddy | |
| 2016/0163903 A1 | 6/2016 | Yang et al. | |
| 2016/0163907 A1 | 6/2016 | Gonzalez et al. | |
| 2016/0163908 A1 | 6/2016 | Gonzalez et al. | |
| 2016/0163909 A1 | 6/2016 | Gonzalez et al. | |
| 2016/0163912 A1 | 6/2016 | Gonzalez et al. | |
| 2016/0163913 A1 | 6/2016 | Gonzalez | |
| 2016/0163914 A1 | 6/2016 | Gonzalez et al. | |

FOREIGN PATENT DOCUMENTS

| | | |
|---|---|---|
| DE | 102009026027 A1 | 1/2011 |
| EM | 002032581-0005 | 4/2012 |
| EP | 2284908 A1 | 2/2011 |
| EP | 2362430 A1 | 8/2011 |
| ES | 2146182 A1 | 7/2000 |
| FR | 910321-001 | 1/1991 |
| JP | 11-350685 A | 12/1999 |
| JP | 2014017447 A | 1/2014 |
| WO | 2009047815 A1 | 4/2009 |
| WO | 2010095583 A1 | 8/2010 |
| WO | 2012033657 A2 | 3/2012 |
| WO | 2012099705 A2 | 7/2012 |
| WO | 2013020590 A1 | 2/2013 |
| WO | 2014074826 A2 | 5/2014 |
| WO | 2014098771 A1 | 6/2014 |
| WO | 2014192272 A1 | 12/2014 |
| WO | 2015001413 A1 | 1/2015 |

OTHER PUBLICATIONS

Epoxy Technology, EPO-TEK H20E Technical Data Sheet, p. 1-2.*
D.W.K. Eikelboom, Conductive Adhesives for Low Stress Interconnection of Thin Back-Contact Solar Cells, IEEE, 2002.*
Materials Data Book 2003 Edition, Cambridge University Engineering Department.*
Engineered Conductive Materials Introduces DB-1541-S3 Low Cost Ribbon Attach Conductive Adhesive.*
Goldberg, Lee H., "Active Bypass Diodes Improve Solar Panel Efficiency and Performance", Digi-Key Corporation, http://www.digikey.com/en/articles/techzone/2012/dec/activebypassdiodesimprovesolarpanelefficiencyandperformance, Dec. 12, 2012, 8 pages.
Herrmann, W. et al., "Operational Behaviour of Commercial Solar Cells Under Reverse Biased Conditins", TÜV Rheinland Sicherheit und Umweltschutz GmbH, 3 pages.
Creative Materials, "Product Announcement: Flexible Electrically Conductive Adhesive Family as Solder Replacements in Solar Cells", http://www.creativematerials.com/news/pr-conductive-adhesive-for-solar-cells.php, Feb. 9, 2015, 2 pages.
Creative Materials, "124-08 A/B Electrically Conductive Epoxy Adhesive", www.creativematerials.com, Apr. 22, 2010, Revision: E, 1 page.
Herrmann, W. et al. "Hot Spot Investigations on PV Modules—New Concepts for a Test Standard and Consequences for Module Design with Respect to Bypass Diodes", TÜV Rheinland Sicherheit und Umweltschutz GmbH, 4 pages.
Yang, et al., "Investigation of the Relationship between Reverse Current of Crystalline Silicon Solar Cells and Conduction of Bypass Diode", Hindawi Publishing Corporation International Journal of Photoenergy, vol. 2012, Article ID 357218, 6 pages.
Breitenstein, O. et al., "Shunts due to laser scribing of solar cells evaluated by highly sensitive lock-in thermography", 11th International Photovoltaic Science and Engineering Conference (PVSEC-11), Sep. 20-24, 1999 Sapporo, Japan, 9 pages.
KYOCERA, News Releases 2009, "KYOCERA Explains Innovations Used in Solar Panel for New Toyota Prius", http://global.kyocera.com/new/2009/0902/fpri.html, Dec. 21, 2014, 2 pages.
Herrmann, W. et al., "Hot Spot Investigations on PV Modules—New Concepts for a Test Standard and Consequences for Module Design with Respect to Bypass Diodes," TÜV Rheinland Sicherheit and Umweltschutz GmbH, http://ieeexplore.ieee.org, Dec. 20, 2014, 6 pages.
Mäki, et al., "Power Losses in Long String and Parallel-Connected Short Strings of Series-Connected Silicon-Based Photovoltaic Modules Due to Partial Shading Conditions", IEEE Transactions on Energy Conversion, vol. 27, No. 1, Mar. 2012, pp. 173-183.
Halavani, et al., "Results of Pressue-Only Cell Interconnections in High Voltage PV-Modules", 29th European Photovoltaic Solar Energy Conference and Exhibition, Vienna University of Technology, pp. 64-68.
Heimann, M., et al., "Ultrasonic Bonding of Aluminum Ribbons to Interconnect High-Efficiency Crystalline-Silicon Solar Cells", Energy Procedia 27 (2012) pp. 670-675.
Silvestre S., et al., "Study of bypass diodes configuration on PV modules", Applied Energy 86 (2009) pp. 1632-1640.
Scholten, "Silicone Encapsulation of c-Si Photovoltaic Modules", Solar Novus Today, Feb. 10, 2014, 5 pages, http://www.solarnovus.com.
3M™ "Thermally Conductive Heat Spreading Tape, 9876B-05, 9876B-08, 9876-10, 9876-15", Nov. 2012, pp. 1-4.
STMicroelectronics, "How to choose a bypass diode for a silicon panel junction box", Sep. 2011, pp. 1-24.
Kray, D., et al., "Reducing AG Cost and Increasing Efficiency. Multicrystalline Silicon Solar Cells With Direct Plated contacts Exceeding 17% Efficiency", 26th EU PVSEC Proceedings, pp. 1199-1202.
Matula, J. Phys. Chem. Ref. Daa, vol. 8, No. 4, 1979.
U.S. Appl. No. 62/088,509 "System, Method, and Apparatus for Automatic Manufacturing of Solar Panels" filed Dec. 5, 2014, Jiunn Benjamin Heng, et al., 28 pages.
U.S. Appl. No. 62/143,694 "Systems and Methods for Precision Automation of Manufacturing Solar Panels" filed Apr. 6, 2015, Jiunn Benjamin Heng, et al., 101 pages.

* cited by examiner

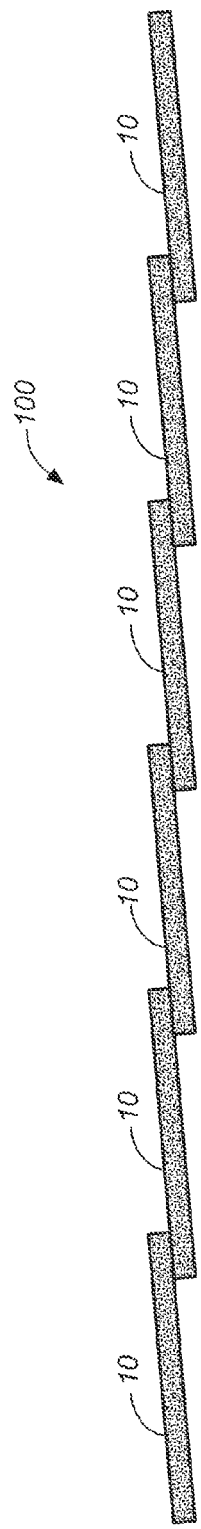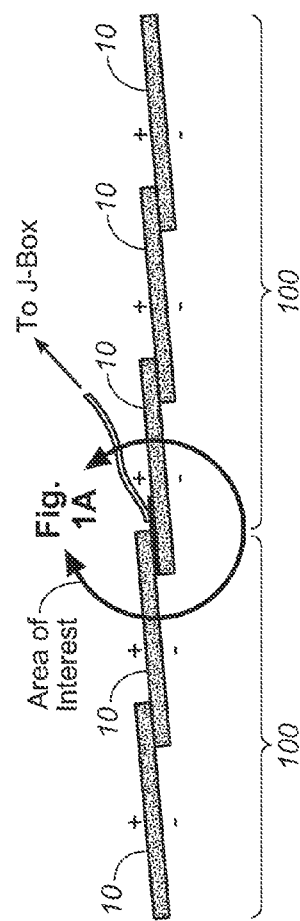

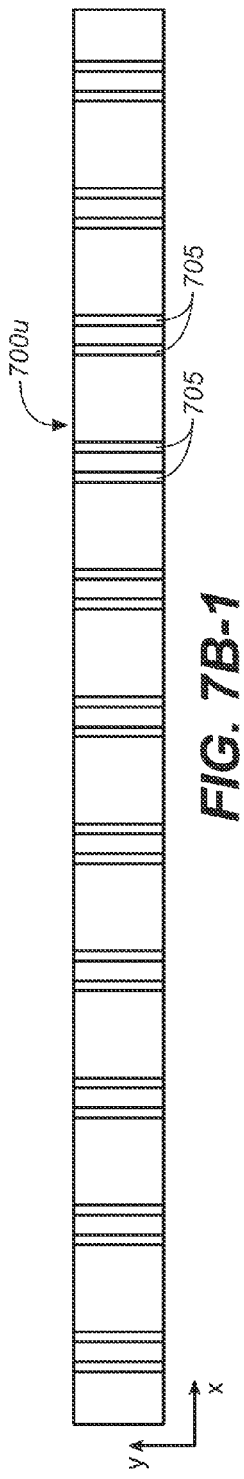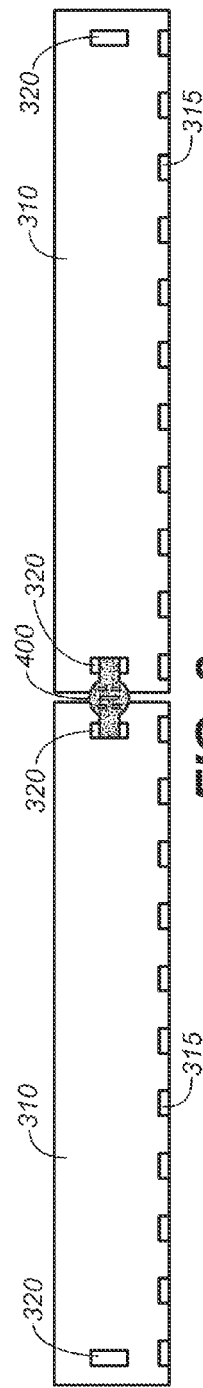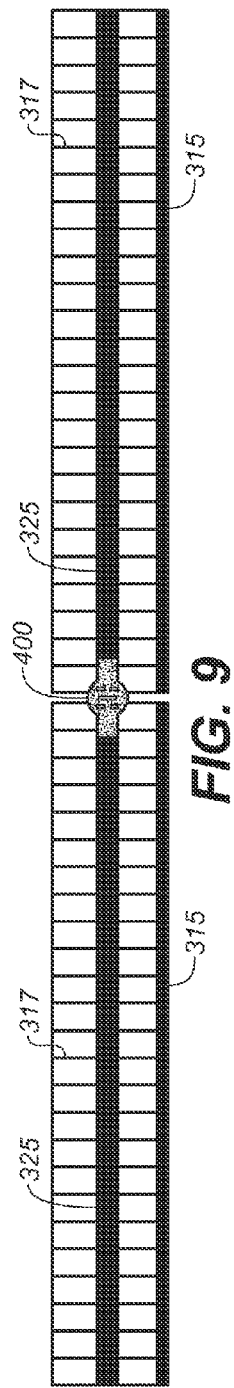
FIG. 7B-1    FIG. 7B-2    FIG. 8    FIG. 9

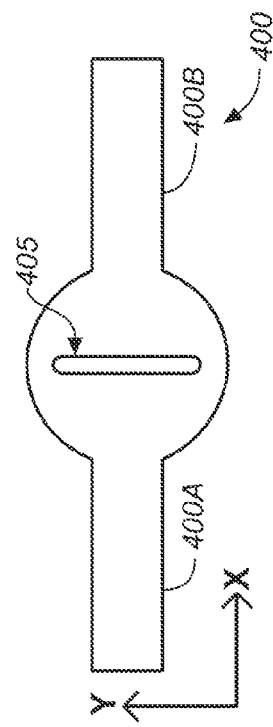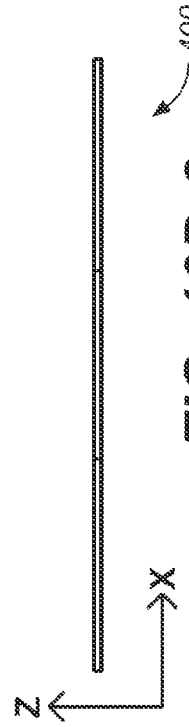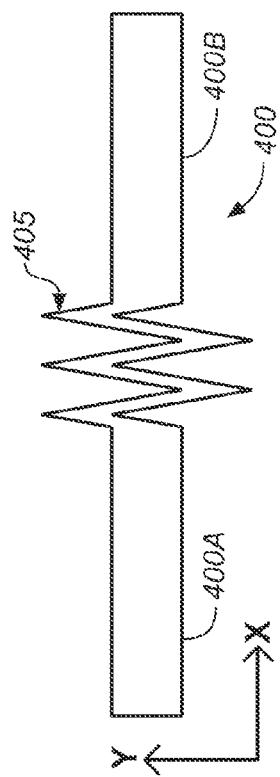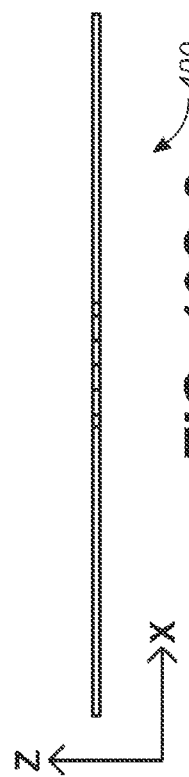

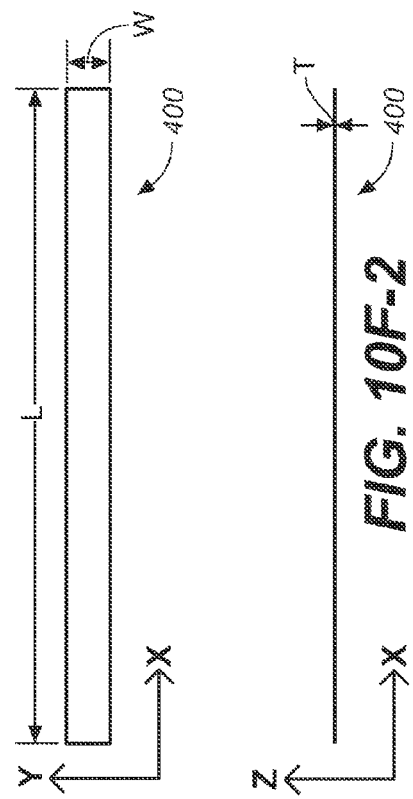
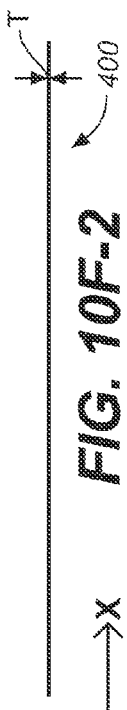
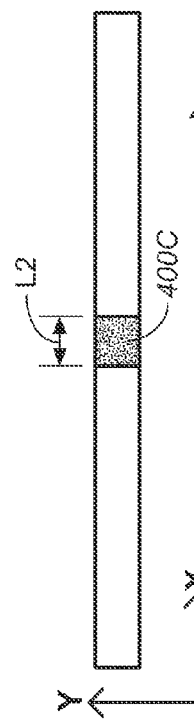
FIG. 10F-1
FIG. 10F-2
FIG. 10F-3
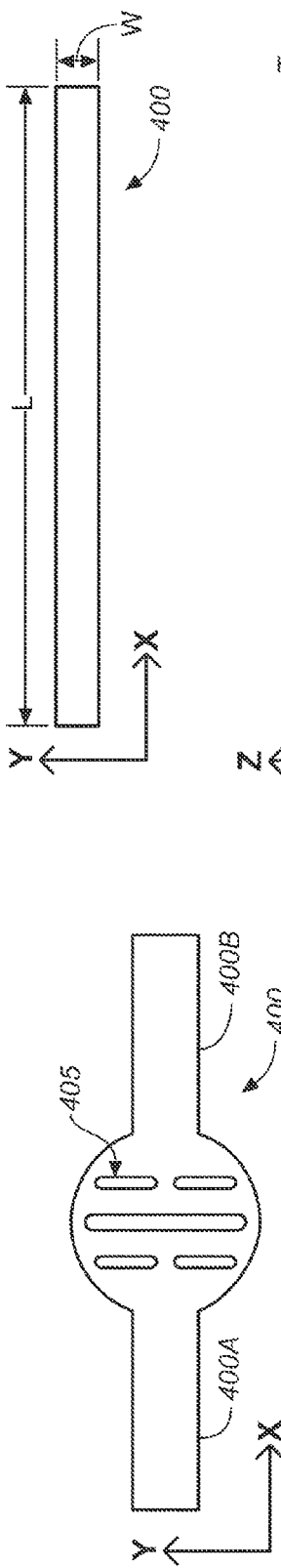
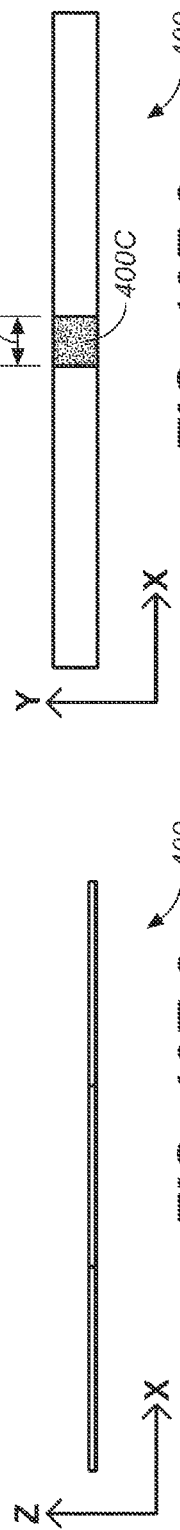
FIG. 10E-1
FIG. 10E-2

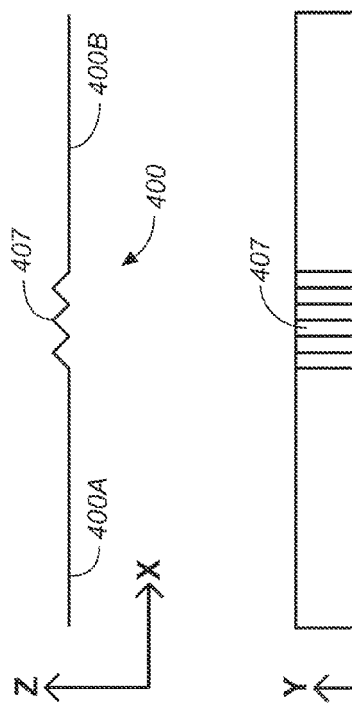
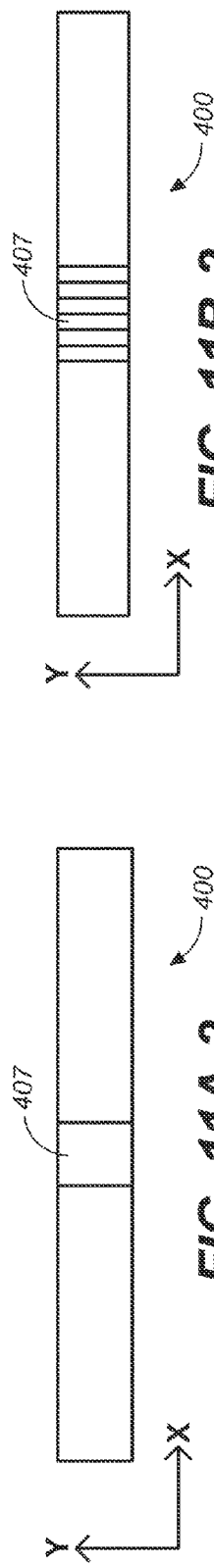
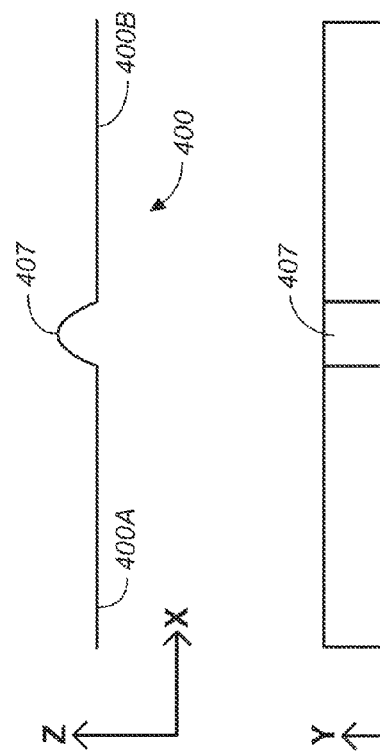

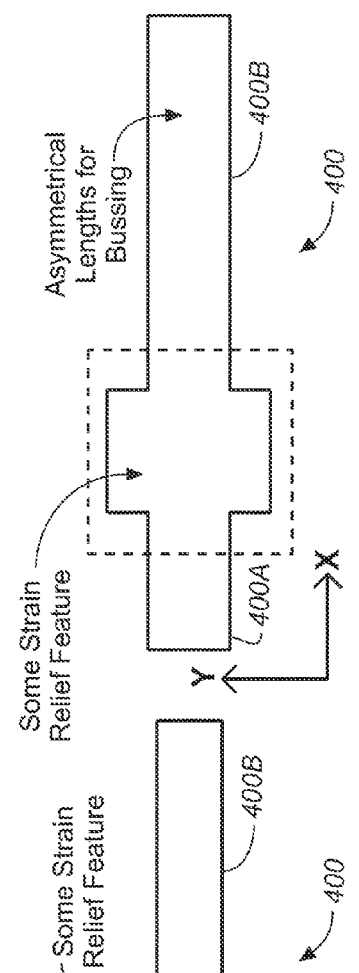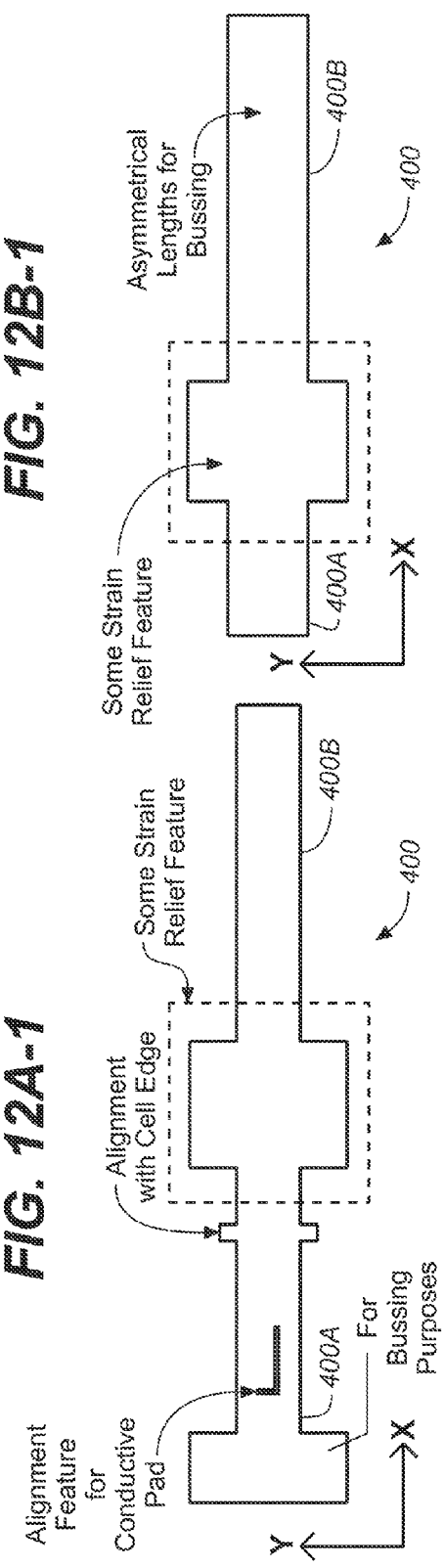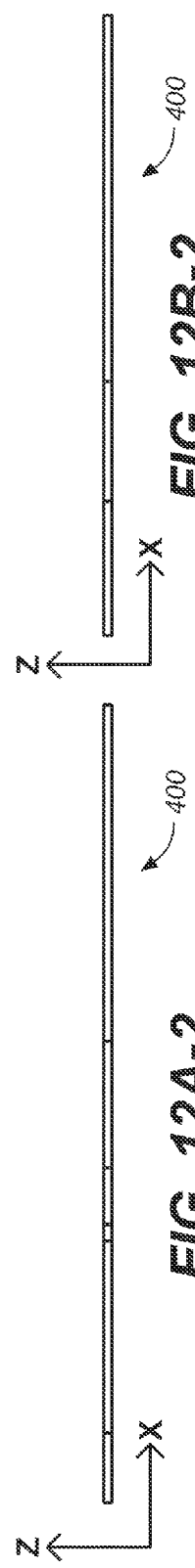
FIG. 12A-1
FIG. 12B-1
FIG. 12A-2
FIG. 12B-2

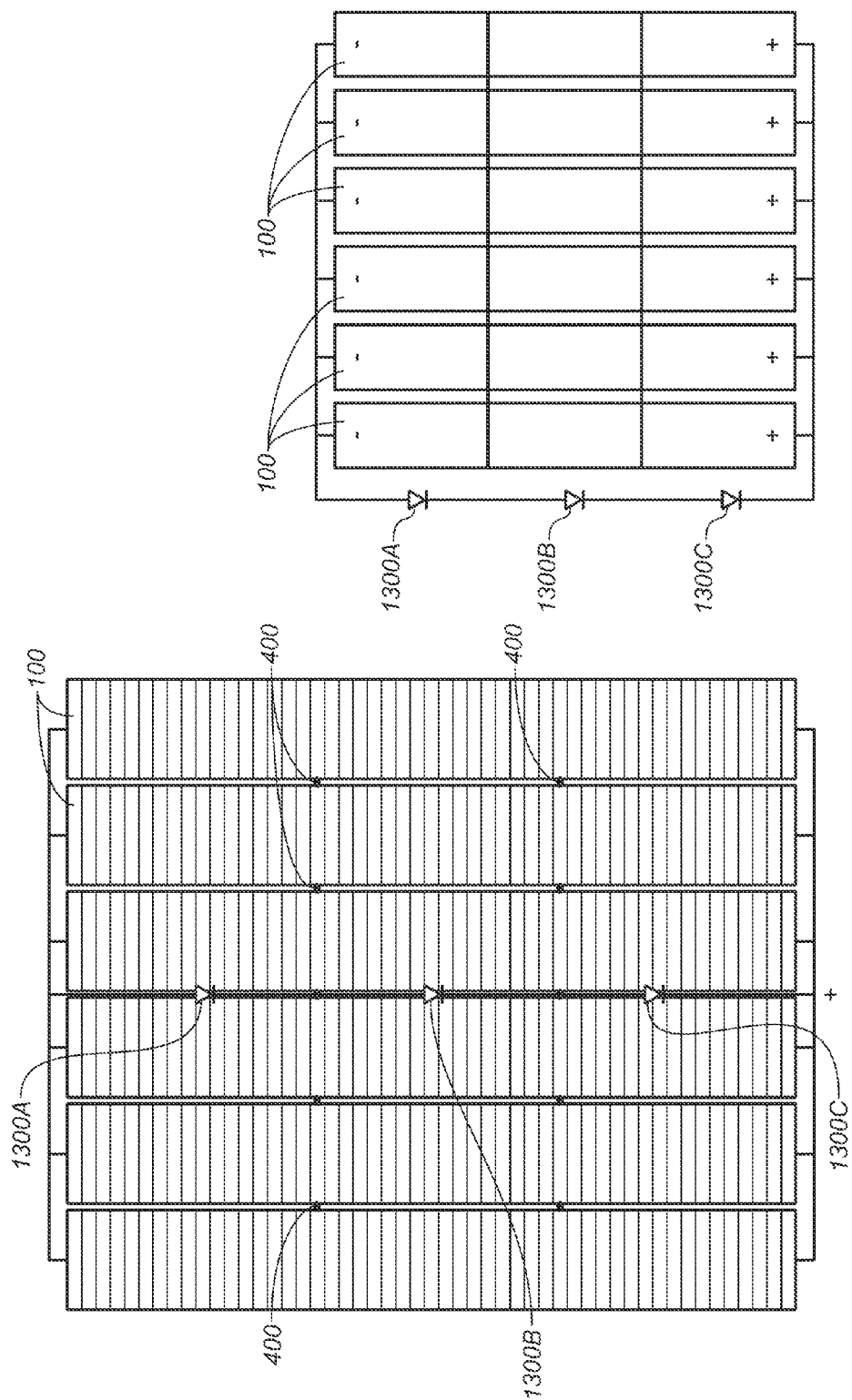

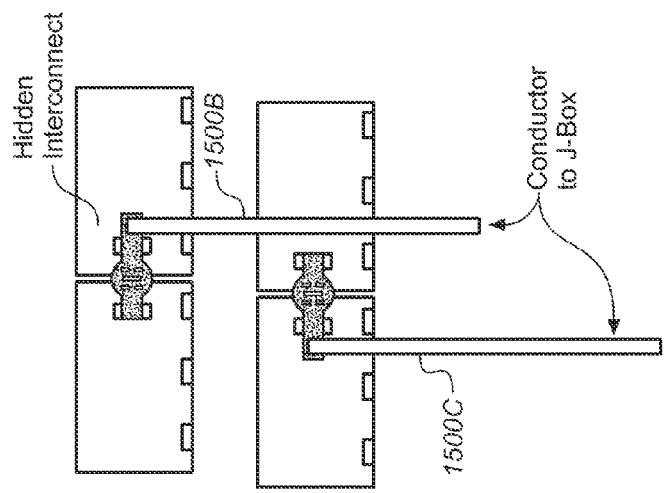
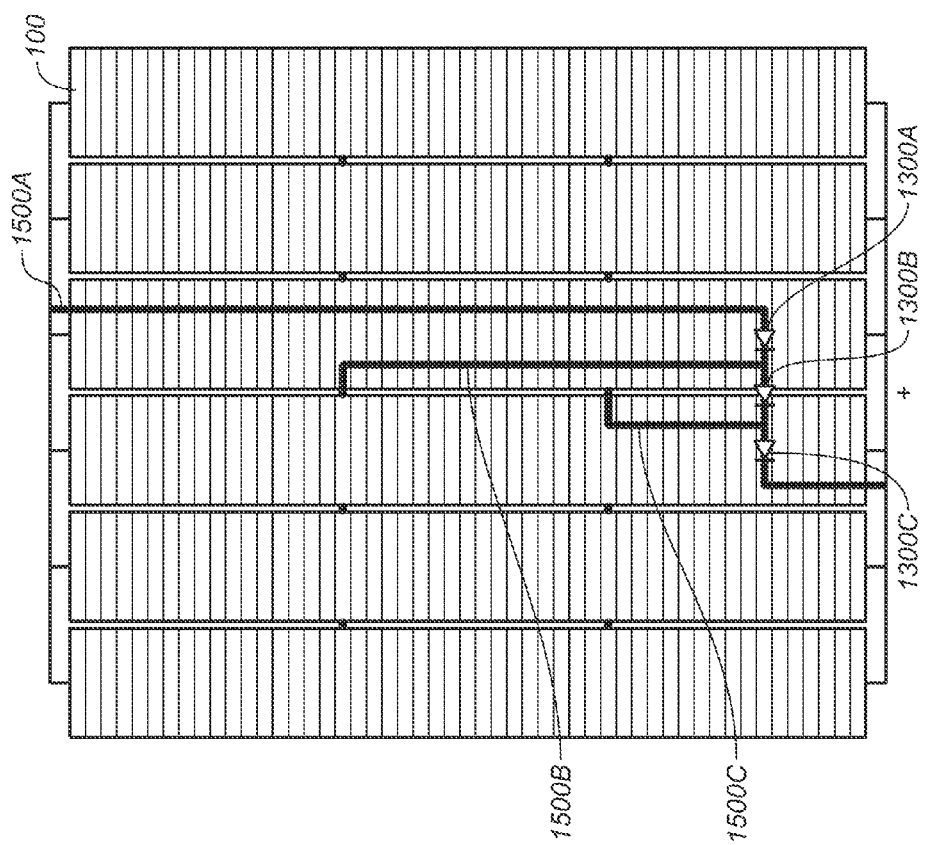
FIG. 15B
FIG. 15A

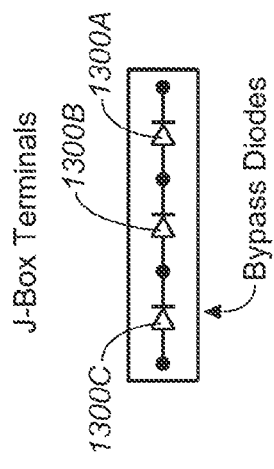
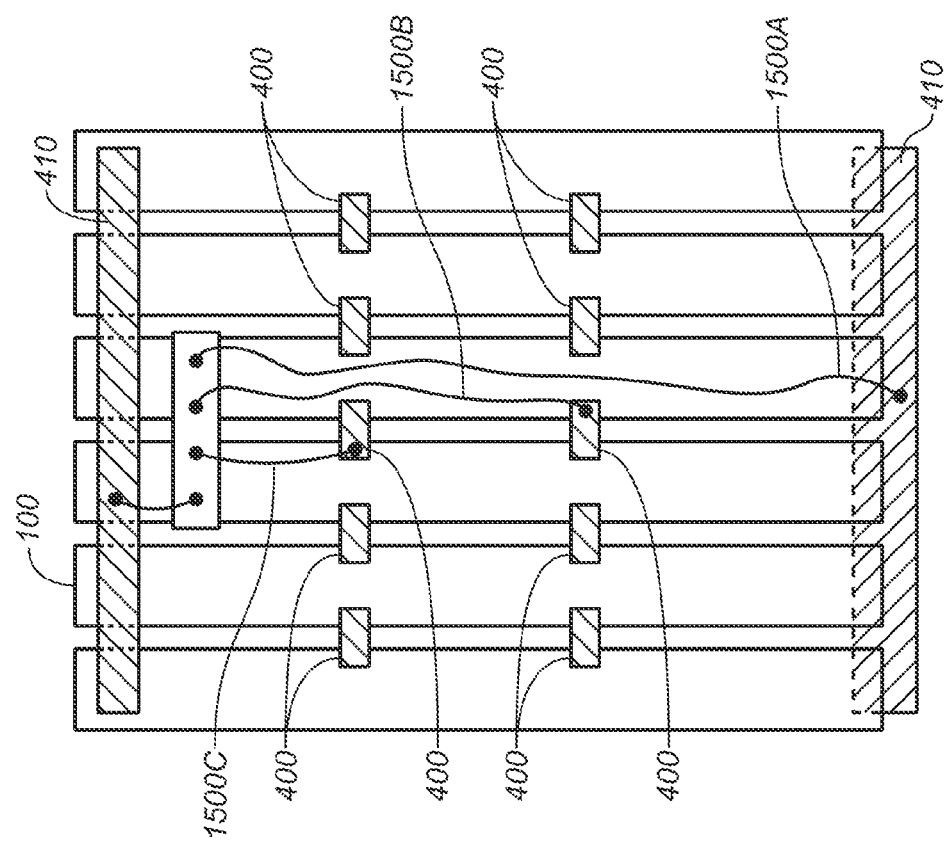

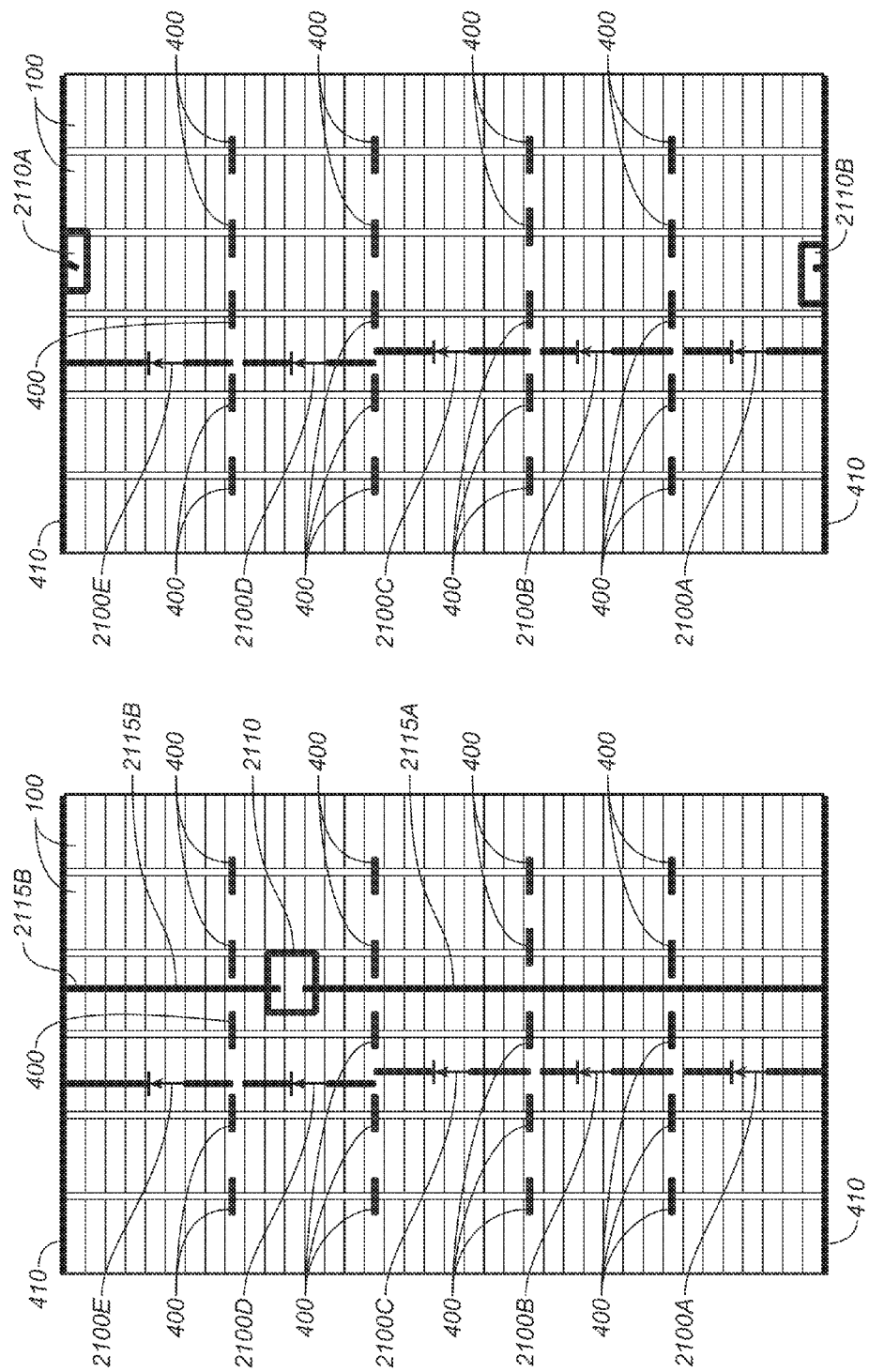

SHINGLED SOLAR CELL PANEL EMPLOYING HIDDEN TAPS

CROSS REFERENCE TO RELATED APPLICATIONS

This application is a Continuation-In-Part of U.S. patent application Ser. No. 14/530,405 titled "Shingled Solar Cell Module" and filed Oct. 31, 2014, which claims priority to U.S. Provisional Patent Application No. 62/064,834 titled "Shingled Solar Cell Module" filed Oct. 16, 2014, U.S. Provisional Patent Application No. 62/064,260 titled "Shingled Solar Cell Module" filed Oct. 15, 2014, U.S. Provisional Patent Application No. 62/048,858 titled "Shingled Solar Cell Module" filed Sep. 11, 2014, U.S. Provisional Patent Application No. 62/042,615 titled "Shingled Solar Cell Module" filed Aug. 27, 2014, U.S. Provisional Patent Application No. 62/036,215 titled "Shingled Solar Cell Module" filed Aug. 12, 2014, and U.S. Provisional Patent Application No. 62/003,223 titled "Shingled Solar Cell Module" filed May 27, 2014. This application also claims priority to U.S. Provisional Patent Application No. 62/113,250 titled "Shingled Solar Cell Panel Employing Hidden Taps" and filed Feb. 6, 2015, and U.S. Provisional Patent Application No. 62/081,200 titled "Solar Panel Employing Hidden Taps" and filed Nov. 18, 2014. Each of the patent applications referenced in this paragraph is incorporated herein by reference in its entirety for all purposes.

FIELD OF THE INVENTION

The invention relates generally to solar cell modules in which the solar cells are arranged in a shingled manner.

BACKGROUND

Alternate sources of energy are needed to satisfy ever increasing world-wide energy demands. Solar energy resources are sufficient in many geographical regions to satisfy such demands, in part, by provision of electric power generated with solar (e.g., photovoltaic) cells.

SUMMARY

In one aspect, a solar module comprises a plurality of super cells arranged in two or more parallel rows. Each super cell comprises a plurality of rectangular or substantially rectangular silicon solar cells arranged in line with long sides of adjacent silicon solar cells overlapping and conductively bonded directly to each other to electrically connect the silicon solar cells in series. The solar panel also comprises a first hidden tap contact pad located on a back surface of a first solar cell located at an intermediate position along a first one of the super cells, and a first electrical interconnect conductively bonded to the first hidden tap contact pad. The first electrical interconnect comprises a stress relieving feature accommodating differential thermal expansion between the interconnect and the silicon solar cell to which it is bonded. The term "stress relieving feature" as used herein with respect to an interconnect may refer to a geometrical feature such as a kink, loop, or slot, for example, to the thickness (e.g., very thin) of the interconnect, and/or to the ductility of the interconnect. For example, the stress relieving feature may be that the interconnect is formed from very thin copper ribbon.

The solar module may comprise a second hidden tap contact pad located on a back surface of a second solar cell located adjacent the first solar cell at an intermediate position along a second one of the super cells in an adjacent super cell row, with the first hidden tap contact pad electrically connected to the second hidden tap contact pad through the first electrical interconnect. In such cases the first electrical interconnect may extend across a gap between the first super cell and the second super cell and be conductively bonded to the second hidden tap contact pad. Alternatively the electrical connection between the first and second hidden tap contact pads may include another electrical interconnect conductively bonded to the second hidden tap contact pad and electrically connected (e.g., conductively bonded) to the first electrical interconnect. Either interconnection scheme may optionally extend across additional rows of super cells. For example, either interconnection scheme may optionally extend across the full width of the module to interconnect a solar cell in each row via the hidden tap contact pads.

The solar module may comprise a second hidden tap contact pad located on a back surface of a second solar cell located at another intermediate position along the first one of the super cells, a second electrical interconnect conductively bonded to the second hidden tap contact pad, and a bypass diode electrically connected by the first and second electrical interconnects in parallel with the solar cells located between the first hidden tap contact pad and the second hidden tap contact pad.

In any of the above variations, the first hidden tap contact pad may be one of a plurality of hidden tap contact pads arranged on the back surface of the first solar cell in a row running parallel to the long axis of the first solar cell, with the first electrical interconnect conductively bonded to each of the plurality of hidden contacts and substantially spanning the length of the first solar cell along the long axis. In addition or alternatively, the first hidden contact pad may be one of a plurality of hidden tap contact pads arranged on the back surface of the first solar cell in a row running perpendicular to the long axis of the first solar cell. In the latter case the row of hidden tap contact pads may be located adjacent a short edge of the first solar cell, for example. The first hidden contact pad may be one of a plurality of hidden tap contact pads arranged in a two dimensional array of the back surface of the first solar cell.

Alternatively, in any of the above variations the first hidden tap contact pad may be located adjacent a short side of the back surface of the first solar cell, with the first electrical interconnect not extending substantially inward from the hidden tap contact pad along the long axis of the solar cell, and the back surface metallization pattern on the first solar cell providing a conductive path to the interconnect preferably having a sheet resistance less than or equal to about 5 Ohms per square, or less than or equal to about 2.5 Ohms per square. In such cases the first interconnect may comprise, for example, two tabs positioned on opposite sides of the stress relieving feature, with one of the tabs conductively bonded to the first hidden tap contact pad. The two tabs may be of different lengths.

In any of the above variations the first electrical interconnect may comprise alignment features identifying a desired alignment with the first hidden tap contact pad, or identifying a desired alignment with an edge of the first super cell, or identifying a desired alignment with the first hidden tap contact pad and a desired alignment with an edge of the first super cell.

In another aspect a solar module comprises a glass front sheet, a back sheet, and a plurality of super cells arranged in two or more parallel rows between the glass front sheet and the back sheet. Each super cell comprises a plurality of rectangular or substantially rectangular silicon solar cells arranged in line with long sides of adjacent silicon solar cells overlapping and flexibly conductively bonded directly to each other to electrically connect the silicon solar cells in series. A first flexible electrical interconnect is rigidly conductively bonded to a first one of the super cells. The flexible conductive bonds between overlapping solar cells provide mechanical compliance to the super cells accommodating a mismatch in thermal expansion between the super cells and the glass front sheet in a direction parallel to the rows for a temperature range of about −40° C. to about 100° C. without damaging the solar module. The rigid conductive bond between the first super cell and the first flexible electrical interconnect forces the first flexible electrical interconnect to accommodate a mismatch in thermal expansion between the first super cell and the first flexible interconnect in a direction perpendicular to the rows for a temperature range of about −40° C. to about 180° C. without damaging the solar module.

The conductive bonds between overlapping adjacent solar cells within a super cell may utilize a different conductive adhesive than the conductive bonds between the super cell and the flexible electrical interconnect. The conductive bond at one side of at least one solar cell within a super cell may utilize a different conductive adhesive than the conductive bond at its other side. The conductive adhesive forming the rigid bond between the super cell and the flexible electrical interconnect may be a solder, for example. In some variations the conductive bonds between overlapping solar cells within a super cell are formed with a non-solder conductive adhesive, and the conductive bond between the super cell and the flexible electrical interconnect is formed with solder.

In some variations utilizing two different conductive adhesives as just described, both conductive adhesives can be cured in the same processing step (e.g., at the same temperature, at the same pressure, and/or in the same time interval).

The conductive bonds between overlapping adjacent solar cells may accommodate differential motion between each cell and the glass front sheet of greater than or equal to about 15 microns, for example.

The conductive bonds between overlapping adjacent solar cells may have a thickness perpendicular to the solar cells of less than or equal to about 50 microns and a thermal conductivity perpendicular to the solar cells greater than or equal to about 1.5 W/(meter-K), for example.

The first flexible electrical interconnect may withstand thermal expansion or contraction of the first flexible interconnect of greater than or equal to about 40 microns, for example.

The portion of the first flexible electrical interconnect conductively bonded to the super cell may be ribbon-like, formed from copper, and have a thickness perpendicular to the surface of the solar cell to which it is bonded of less than or equal to about 30 microns or less than or equal to about 50 microns, for example. The first flexible electrical interconnect may comprise an integral conductive copper portion not bonded to the solar cell and providing a higher conductivity than the portion of the first flexible electrical interconnect that is conductively bonded to the solar cell. The first flexible electrical interconnect may have a thickness perpendicular to the surface of the solar cell to which it is bonded of less than or equal to about 30 microns or less than or equal to about 50 microns, and a width greater than or equal to about 10 mm in the plane of the surface of the solar cell in a direction perpendicular to the flow of current though the interconnect. The first flexible electrical interconnect may be conductively bonded to a conductor proximate to the solar cell that provides higher conductivity than the first electrical interconnect.

In another aspect, a solar module comprises a plurality of super cells arranged in two or more parallel rows. Each super cell comprises a plurality of rectangular or substantially rectangular silicon solar cells arranged in line with long sides of adjacent silicon solar cells overlapping and conductively bonded directly to each other to electrically connect the silicon solar cells in series. A hidden tap contact pad which does not conduct significant current in normal operation is located on a back surface of a first solar cell, which is located at an intermediate position along a first one of the super cells in a first one of the rows of super cells. The hidden tap contact pad is electrically connected in parallel to at least a second solar cell in a second one of the rows of super cells.

The solar module may comprise an electrical interconnect bonded to the hidden tap contact pad and electrically interconnecting the hidden tap contact pad to the second solar cell. In some variations the electrical interconnect does not substantially span the length of the first solar cell and a back surface metallization pattern on the first solar cell provides a conductivity path to the hidden tap contact pad having a sheet resistance less than or equal to about 5 Ohms per square.

The plurality of super cells may be arranged in three or more parallel rows spanning the width of the solar module perpendicular to the rows, and the hidden tap contact pad electrically connected to a hidden contact pad on at least one solar cell in each of the rows of super cells to electrically connect all of the rows of super cells in parallel. In such variations the solar module may comprise at least one bus connection to at least one of the hidden tap contact pads, or to an interconnect between hidden tap contact pads, that connects to a bypass diode or other electronic device.

The solar module may comprise a flexible electrical interconnect conductively bonded to the hidden tap contact pad to electrically connect it to the second solar cell. The portion of the flexible electrical interconnect conductively bonded to the hidden tap contact pad may be for example ribbon-like, formed from copper, and have a thickness perpendicular to the surface of the solar cell to which it is bonded of less than or equal to about 50 microns. The conductive bond between the hidden tap contact pad and the flexible electrical interconnect may force the flexible electrical interconnect to withstand a mismatch in thermal expansion between the first solar cell and the flexible interconnect, and to accommodate relative motion between the first solar cell and the second solar cell resulting from thermal expansion, for a temperature range of about −40° C. to about 180° C. without damaging the solar module.

In some variations, in operation of the solar module the first hidden contact pad may conduct a current greater than the current generated in any single one of the solar cells.

Typically, the front surface of the first solar cell overlying the first hidden tap contact pad is not occupied by contact pads or any other interconnect features. Typically, any area of the front surface of the first solar cell which is not overlapped by a portion of an adjacent solar cell in the first super cell is not occupied by contact pads or any other interconnect features.

In some variations, in each super cell most of the cells do not have hidden tap contact pads. In such variations, the cells that have hidden tap contact pads may have a larger light collection area than the cells that do not have hidden tap contact pads.

In another aspect, a solar module comprises a glass front sheet, a back sheet, and a plurality of super cells arranged in two or more parallel rows between the glass front sheet and the back sheet. Each super cell comprises a plurality of rectangular or substantially rectangular silicon solar cells arranged in line with long sides of adjacent silicon solar cells overlapping and flexibly conductively bonded directly to each other to electrically connect the silicon solar cells in series. A first flexible electrical interconnect is rigidly conductively bonded to a first one of the super cells. The flexible conductive bonds between overlapping solar cells are formed from a first conductive adhesive and have a shear modulus less than or equal to about 800 megapascals. The rigid conductive bond between the first super cell and the first flexible electrical interconnect is formed from a second conductive adhesive and has a shear modulus of greater than or equal to about 2000 megapascals.

The first conductive adhesive may have a glass transition temperature of less than or equal to about 0° C., for example.

In some variations, the first conductive adhesive and the second conductive adhesive are different, and both conductive adhesives can be cured in the same processing step.

In some variations, the conductive bonds between overlapping adjacent solar cells have a thickness perpendicular to the solar cells of less than or equal to about 50 micron and a thermal conductivity perpendicular to the solar cells greater than or equal to about 1.5 W/(meter-K).

These and other embodiments, features and advantages of the present invention will become more apparent to those skilled in the art when taken with reference to the following more detailed description of the invention in conjunction with the accompanying drawings that are first briefly described.

BRIEF DESCRIPTION OF THE DRAWINGS

FIG. 1A shows an enlarged perspective view of an area of interest in FIG. 1AA.

FIGS. 3A-3C show diagrams of example back surface metallization patterns that may be employed to create hidden taps to super cells as described herein.

FIGS. 7B-1 and 7B-2 show an example long interconnect configuration that comprises out-of plane stress relieving features and that may be used in hidden taps to super cells or as interconnects to front or rear surface super cell terminal contacts.

FIGS. 8-9 show examples of the use of hidden taps with short interconnects that span the gap between adjacent super cells but do not extend substantially inward along the long axis of the rectangular solar cells.

FIGS. 10A-1 to 10E-3 show example configurations for short hidden tap interconnects comprising in-plane stress relieving features.

FIGS. 11A-1 to 11B-2 show example configurations for short hidden tap interconnects comprising out-of-plane stress relieving features.

FIGS. 12A-1 and 12A-2 show example configurations for short hidden tap interconnects comprising alignment features. FIGS. 12B-1 and 12B-2 show an example configuration for short hidden tap interconnects that comprises asymmetric tab lengths.

FIGS. 13 and 15A-17B show example solar module layouts employing hidden taps.

FIG. 14 shows an example electrical schematic for the solar module layouts of FIGS. 13 and 15A-17B.

FIGS. 21A-21B show additional solar cell module layouts employing hidden taps in combination with embedded bypass diodes.

DETAILED DESCRIPTION

Figure 1A:
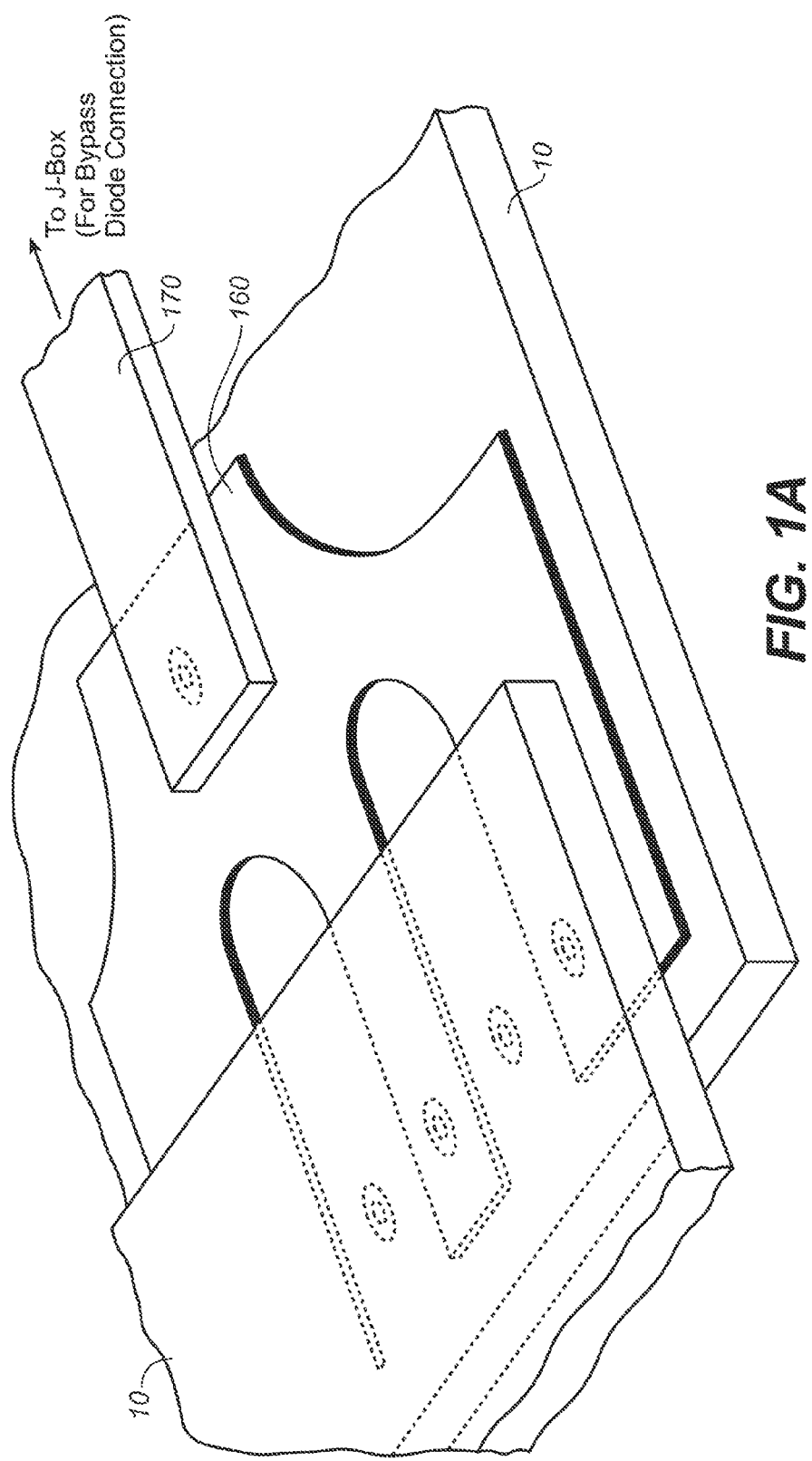
FIG. 1AA shows a fragmentary cross-sectional view of two super cells illustrating the use of a flexible interconnect sandwiched between overlapping ends of adjacent super cells to electrically connect the super cells in series and to provide an electrical connection to a junction box.

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention. This description will clearly enable one skilled in the art to make and use the invention, and describes several embodiments, adaptations, variations, alternatives and uses of the invention, including what is presently believed to be the best mode of carrying out the invention.

As used in this specification and the appended claims, the singular forms "a," "an," and "the" include plural referents unless the context clearly indicates otherwise. Also, the term "parallel" is intended to mean "parallel or substantially parallel" and to encompass minor deviations from parallel geometries rather than to require that any parallel arrangements described herein be exactly parallel. The term "perpendicular" is intended to mean "perpendicular or substantially perpendicular" and to encompass minor deviations from perpendicular geometries rather than to require that any perpendicular arrangement described herein be exactly perpendicular. The term "rectangular" is intended to mean "rectangular or substantially rectangular" and to encompass minor deviations from rectangular shapes.

This specification discloses high-efficiency solar modules comprising silicon solar cells arranged in a shingled manner and electrically connected in series to form super cells, with the super cells arranged in physically parallel rows in the solar module. The super cells may have lengths spanning essentially the full length or width of the solar module, for example, or two or more super cells may be arranged end-to-end in a row. This arrangement hides solar cell-to-solar cell electrical interconnections, and may therefore be used to create a visually appealing solar module with little to no contrast between adjacent series connected solar cells.

A super cell may comprise any number of solar cells, including in some embodiments at least nineteen solar cells and in certain embodiments greater than or equal to 100 silicon solar cells, for example. Electrical contacts at intermediate locations along a super cell may be desired to electrically segment the super cell into two or more series connected segments while maintaining a physically continuous super cell. This specification discloses arrangements in which such electrical connections are made to back surface contact pads of one or more silicon solar cells in the super cell to provide electrical tapping points that are hidden from view from the front of the solar module, and hence referred to herein as "hidden taps". The hidden tap is the electrical connection between the back of the solar cell and a conductive interconnect.

This specification also discloses the use of flexible interconnects to electrically interconnect front surface super cell terminal contact pads, rear surface super cell terminal contact pads, or hidden tap contact pads to other solar cells or to other electrical components in the solar module.

In addition, this specification discloses the use of an electrically conductive adhesive to directly bond adjacent solar cells to each other in a super cell to provide mechanically compliant electrically conductive bonds that accommodate a mismatch in thermal expansion between the super cells and a glass front sheet of the solar module, in combination with the use of an electrically conductive adhesive to bond flexible interconnects to the super cells with mechanically stiff bonds that force the flexible interconnects to accommodate a mismatch in thermal expansion between flexible interconnects and the super cells. This avoids damage to the solar module that may otherwise occur as a result of thermal cycling of the solar module.

As further described below, electrical connections to hidden tap contact pads may be used to electrically connect segments of a super cell in parallel with corresponding segments of one or more super cells in adjacent rows, and/or to provide electrical connections to the solar module circuit for various applications including but not limited to power optimization (e.g., bypass diodes, AC/DC micro-inverters, DC/DC converters) and reliability applications.

Use of hidden taps as just described may further enhance the aesthetic appearance of the solar module by providing in combination with the hidden cell-to-cell connections a substantially all black appearance for the solar module, and may also increase the efficiency of the solar module by allowing a larger portion of the surface area of the module to be filled by the active areas of the solar cells.

Figures 1, 10A:
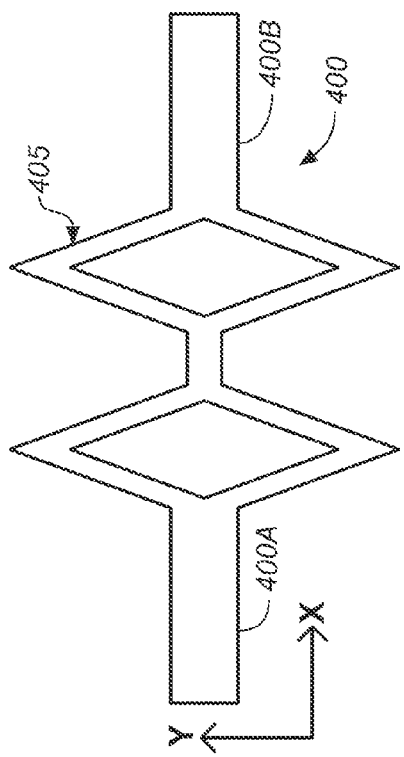
Figures 2, 10A:
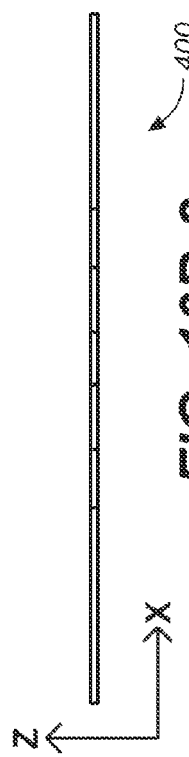
Figures 1, 10B:
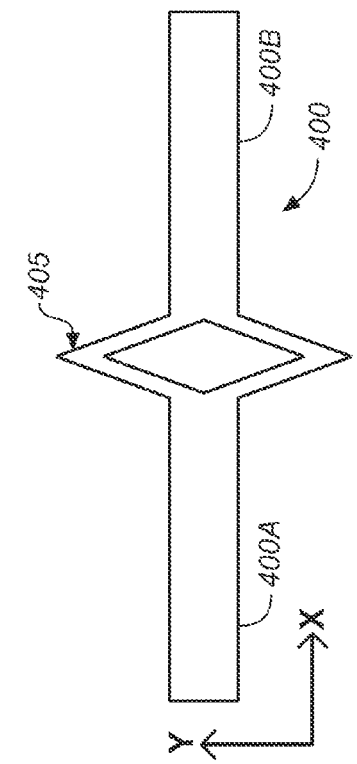
FIG. 1 shows a cross-sectional diagram of a string of series-connected solar cells arranged in a shingled manner with the ends of adjacent solar cells overlapping to form a shingled super cell.
Figures 2, 10B:

Turning now to the figures for a more detailed understanding of the solar modules described in this specification, FIG. 1 shows a cross-sectional view of a string of series-connected solar cells 10 arranged in a shingled manner with the ends of adjacent solar cells overlapping and electrically connected to form a super cell 100. Each solar cell 10 comprises a semiconductor diode structure and electrical contacts to the semiconductor diode structure by which electric current generated in solar cell 10 when it is illuminated by light may be provided to an external load.

In the examples described in this specification, each solar cell 10 is a rectangular crystalline silicon solar cell having front (sun side) surface and rear (shaded side) surface metallization patterns providing electrical contact to opposite sides of an n-p junction, the front surface metallization pattern is disposed on a semiconductor layer of n-type conductivity, and the rear surface metallization pattern is disposed on a semiconductor layer of p-type conductivity. However, other material systems, diode structures, physical dimensions, or electrical contact arrangements may be used if suitable. For example, the front (sun side) surface metallization pattern may be disposed on a semiconductor layer of p-type conductivity, and the rear (shaded side) surface metallization pattern disposed on a semiconductor layer of n-type conductivity.

Referring again to FIG. 1, in super cell 100 adjacent solar cells 10 are conductively bonded directly to each other in the region in which they overlap by an electrically conducting bonding material that electrically connects the front surface metallization pattern of one solar cell to the rear surface metallization pattern of the adjacent solar cell. Suitable electrically conducting bonding materials may include, for example, electrically conducting adhesives and electrically conducting adhesive films and adhesive tapes, and conventional solders.

FIGS. 1AA and 1A show the use of an example flexible interconnect 160 partially sandwiched between and electrically interconnecting the overlapping ends of two super cells 100 to provide an electrical connection to the front surface end contact of one of the super cells and to the rear surface end contact of the other super cell, thereby interconnecting the super cells in series. In the illustrated example, interconnect 160 is hidden from view from the front of the solar module by the upper of the two overlapping solar cells. In another variation, the adjacent ends of the two super cells do not overlap and the portion of interconnect 160 connected to the front surface end contact of one of the two super cells may be visible from the front surface of the solar module. Optionally, in such variations the portion of the interconnect that is otherwise visible from the front of the module may be covered or colored (e.g., darkened) to reduce visible contrast between the interconnect and the super cells, as perceived by a human having normal color vision. Interconnect 160 may extend parallel to the adjacent edges of the two super cells beyond the side edges of the super cells to electrically connect the pair of super cells in parallel with a similarly arranged pair of super cells in an adjacent row.

A ribbon conductor 170 may be conductively bonded to interconnect 160 as shown to electrically connect the adjacent ends of the two super cells to electrical components (e.g., bypass diodes and/or module terminals in a junction box) on the rear surface of the solar module. In another variation (not shown) a ribbon conductor 170 may be electrically connected to the rear surface contact of one of the overlapping super cells away from their overlapping ends, instead of being conductively bonded to an interconnect 160. That configuration may also provide a hidden tap to one or more bypass diodes or other electrical components on the rear surface of the solar module.

Figure 2:
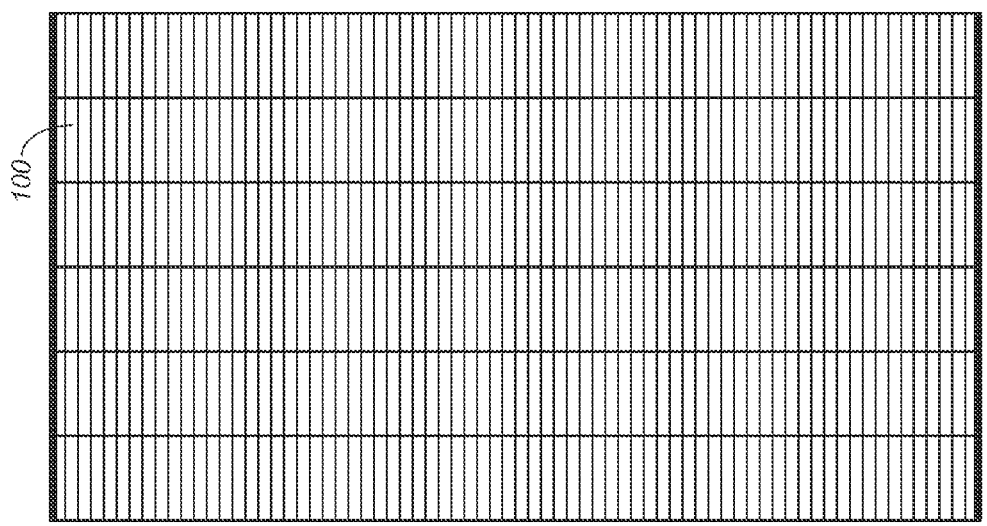
FIG. 2 shows a diagram of an example rectangular solar module comprising a plurality of rectangular shingled super cells, with the long side of each super cell having a length of approximately the full length of the long side of the module. The super cells are arranged with their long sides parallel to the long sides of the module.

FIG. 2 shows an example rectangular solar module 200 comprising six rectangular super cells 100, each of which has a length approximately equal to the length of the long sides of the solar module. The super cells are arranged as six parallel rows with their long sides oriented parallel to the long sides of the module. A similarly configured solar module may include more or fewer rows of such side-length super cells than shown in this example. In other variations the super cells may each have a length approximately equal to the length of a short side of a rectangular solar module, and be arranged in parallel rows with their long sides oriented parallel to the short sides of the module. In yet other arrangements each row may comprise two or more super cells electrically interconnected in series. The modules may have shorts sides having a length, for example, of about 1 meter and long sides having a length, for example, of about 1.5 to about 2.0 meters. Any other suitable shapes (e.g., square) and dimensions for the solar modules may also be used.

Each super cell in this example comprises 72 rectangular solar cells each having a width approximately equal to ⅙ the width of a 156 mm square or pseudo square wafer. Any other suitable number of rectangular solar cells of any other suitable dimensions may also be used.

Solar cells having long and narrow aspect ratios and areas less than that of a standard 156 mm×156 mm solar cell, as illustrated, may be advantageously employed to reduce $I^2R$ resistive power losses in the solar cell modules disclosed in this specification. In particular, the reduced area of solar cells 10 compared to standard size silicon solar cells decreases the current produced in the solar cell, directly reducing resistive power loss in the solar cell and in a series connected string of such solar cells.

A hidden tap to the back surface of a super cell may be made, for example, using an electrical interconnect conductively bonded to one or more hidden tap contact pads located in only an edge portion of the back surface metallization pattern of the solar cell. Alternatively, a hidden tap may be made using an interconnect that runs substantially the full length of the solar cell (perpendicular to the long axis of the super cell) and is conductively bonded to a plurality of hidden tap contact pads distributed along the length of the solar cell in the back surface metallization pattern.

FIG. 3A shows an example solar cell back surface metallization pattern 300 suitable for use with edge-connected hidden taps. The metallization pattern comprises a continuous aluminum electrical contact 310, a plurality of silver contact pads 315 arranged parallel to and adjacent the edge of a long side of the back surface of the solar cell, and silver hidden tap contact pads 320 each arranged parallel to an adjacent edge of one of the short sides of the back surface of the solar cell. When the solar cell is arranged in a super cell, contact pads 315 are overlapped by and directly bonded to the front surface of an adjacent rectangular solar cell. An interconnect may be conductively bonded to one or the other of hidden tap contact pads 320 to provide a hidden tap to the super cell. (Two such interconnects may be employed to provide two hidden taps, if desired).

In the arrangement shown in FIG. 3A, current flow to the hidden tap is through the back surface cell metallization generally parallel to the long sides of the solar cell to the interconnect aggregation point (contact 320). To facilitate current flow along this path, the back surface metallization sheet resistance is preferably less than or equal to about 5 Ohms per square, or less than or equal to about 2.5 Ohms per square.

FIG. 3B shows another example solar cell back surface metallization pattern 301 suitable for use with hidden taps employing a bus-like interconnect along the length of the back surface of a solar cell. The metallization pattern comprises a continuous aluminum electrical contact 310, a plurality of silver contact pads 315 arranged parallel to and adjacent the edge of a long side of the back surface of the solar cell, and a plurality of silver hidden tap contact pads 325 arranged in a row parallel to the long sides of the solar cell and approximately centered on the back surface of the solar cell. An interconnect running substantially the full length of the solar cell may be conductively bonded to hidden tap contact pads 325 to provide a hidden tap to the super cell. Current flow to the hidden tap is primarily through the bus-like interconnect, making the conductivity of the back surface metallization pattern less important to the hidden tap.

The location and number of hidden tap contact pads to which the hidden tap interconnect is bonded on the back surface of a solar cell affects the length of the current path through the back surface metallization of the solar cell, the hidden tap contact pads, and the interconnect. Consequently the arrangement of the hidden tap contact pads may be selected to minimize the resistance to current collection in the current path to and through the hidden tap interconnect. In addition to the configurations shown in FIGS. 3A-3B (and FIG. 3C discussed below), suitable hidden tap contact pad arrangements may include for example a two dimensional array, and a row running perpendicular to the long axis of the solar cell. In the latter case the row of hidden tap contact pads may be located adjacent a short edge of the first solar cell, for example.

FIG. 3C shows another example solar cell back surface metallization pattern 302 suitable for use either with edge-connected hidden taps or hidden taps employing a bus-like interconnect along the length of the back surface of a solar cell. The metallization pattern comprises a continuous copper contact pad 315 arranged parallel to and adjacent the edge of a long side of the back surface of the solar cell, a plurality of copper fingers 317 connected to and extending perpendicularly from contact pad 315, and a continuous copper bus hidden tap contact pad 325 running parallel to the long sides of the solar cell and approximately centered on the back surface of the solar cell. An edge-connected interconnect may be bonded to an end portion of copper bus 325 to provide a hidden tap to the super cell. (Two such interconnects may be employed at either end of copper bus 325 to provide two hidden taps, if desired). Alternatively, an interconnect running substantially the full length of the solar cell may be conductively bonded to copper bus 325 to provide a hidden tap to the super cell.

The interconnect employed to form the hidden tap may be bonded to the hidden tap contact pad in the back surface metallization pattern by soldering, welding, conductive adhesive, or in any other suitable manner. For metallization patterns employing silver pads as illustrated in FIGS. 3A-3B, the interconnect may be formed for example from tin-coated copper. Another approach is to make the hidden tap directly to aluminum back surface contact 310 with an aluminum conductor forming an aluminum to aluminum bond, which may be formed for example by electrical or laser welding, soldering, or conductive adhesive. In certain embodiments, the contacts may comprise tin. In cases as just described, the back surface metallization of the solar cell would lack silver contact pads 320 (FIG. 3A) or 325 (FIG. 3B), but an edge-connected or bus-like aluminum interconnect could be bonded to aluminum (or tin) contact 310 at locations corresponding to those contact pads.

Differential thermal expansion between hidden tap interconnects (or interconnects to front or rear surface super cell terminal contacts) and silicon solar cells, and the resulting stress on the solar cell and the interconnect, can lead to cracking and other failure modes that can degrade performance of the solar module. Consequently, it is desirable that the hidden tap and other interconnects be configured to accommodate such differential expansion without significant stress developing. The interconnects may provide stress and thermal expansion relief by, for example, being formed from highly ductile materials (e.g., soft copper, very thin copper sheet), being formed from low thermal expansion coefficient materials (e.g., Kovar, Invar or other low thermal expansion iron-nickel alloys) or from materials having a thermal expansion coefficient approximately matching that of silicon, incorporating in-plane geometric expansion features such as slits, slots, holes, or truss structures that accommodate differential thermal expansion between the interconnect and the silicon solar cell, and/or employing out-of-plane geometric features such as kinks, jogs, or dimples that accommodate such differential thermal expansion. Portions of the interconnects bonded to hidden tap contact pads (or bonded to super cell front or rear surface terminal contact pads as described below) may have a thickness of, for example, less than about 100 microns, less than about 50 microns, less than about 30 microns, or less than about 25 microns to increase the flexibility of the interconnects.

FIGS. 7A, 7B-1, and 7B-2 show several example interconnect configurations, designated by reference numerals 700A-700U, that employ stress-relieving geometrical features and may be suitable for use as interconnects for hidden taps or for electrical connections to front or rear surface super cell terminal contacts. These interconnects typically have a length approximately equal to the length of the long sides of a rectangular solar cell to which they are bonded, but they may have any other suitable length. Example interconnects 700A-700T shown in FIG. 7A employ various in-plane stress-relieving features. Example interconnect 700U shown in the in-plane (x-y) view of FIG. 7B-1 and in the out-of-plane (x-z) view of FIG. 7B-2 employs bends 405 as out of-plane-stress relieving features in a thin metal ribbon. Bends 405 reduce the apparent tensile stiffness of the metal ribbon. The bends allow the ribbon material to locally bend instead of only elongating when the ribbon is under tension. For thin ribbons, this can significantly reduce the apparent tensile stiffness by, for example, 90% or more. The exact amount of apparent tensile stiffness reduction depends on several factors, including the number of bends, geometry of the bends, and the thickness of the ribbon. An interconnect may also employ in-plane and out-of-plane stress-relieving features in combination.

FIGS. 10A-1 to 11B-2, further discussed below, show several example interconnect configurations that employ in-plane and/or out-of-plane stress relieving geometrical features and may be suitable for use as edge-connected interconnects for hidden taps.

To reduce or minimize the number of conductor runs needed to connect each hidden tap, a hidden tap interconnect bus may be utilized. This approach connects adjacent super cell hidden tap contact pads to one another by using a hidden tap interconnect. (The electrical connection is typically positive-to-positive or negative-to-negative, i.e. the same polarity at each end).

Figure 3:
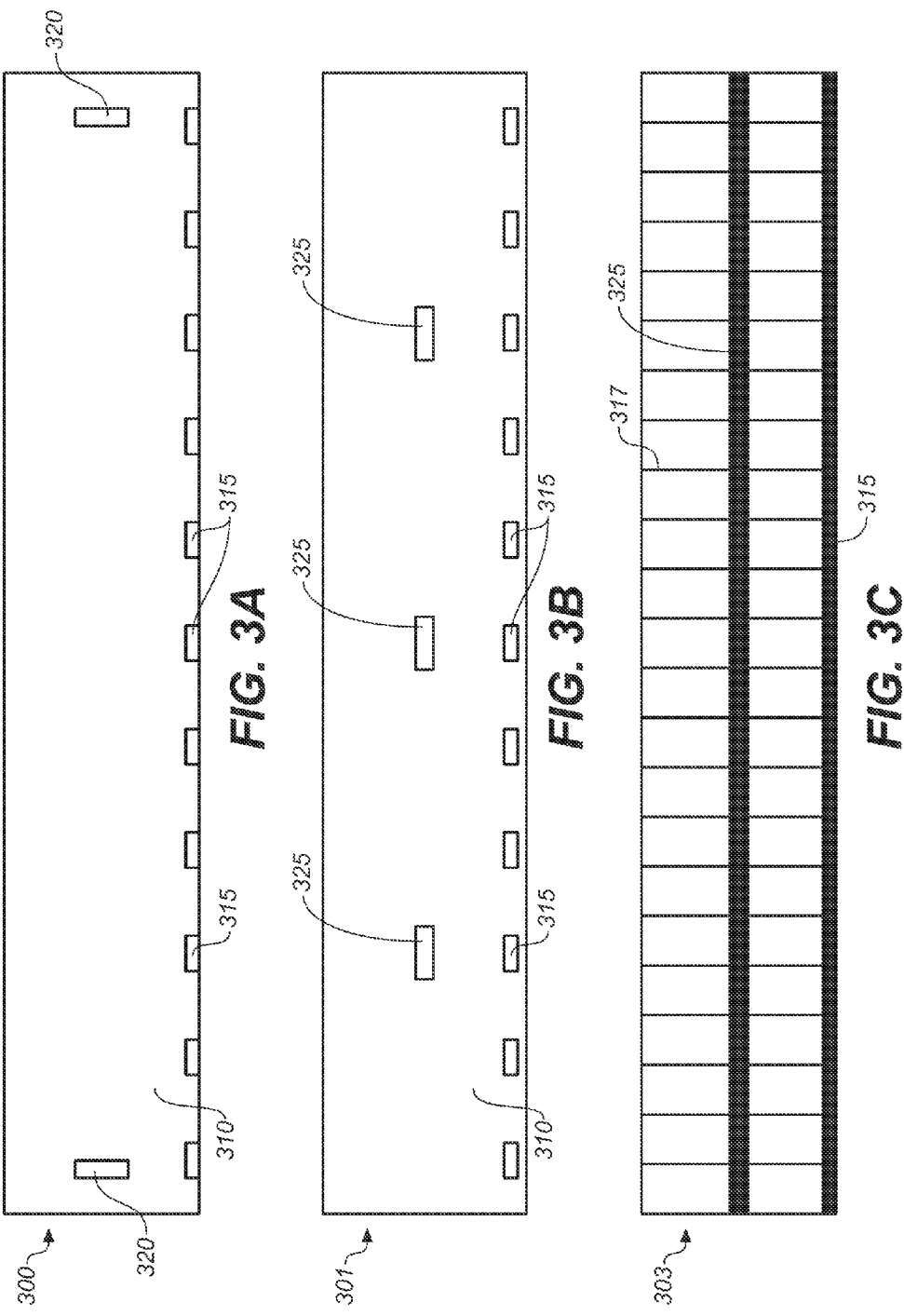
Figure 4:
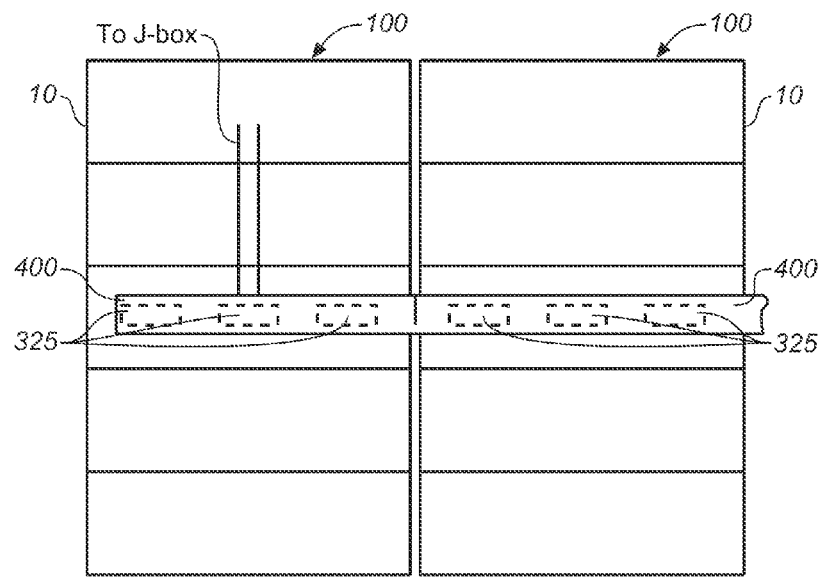
FIGS. 4-5 show examples of the use of hidden taps with interconnects that run approximately the full width of the super cell.
Figure 5:
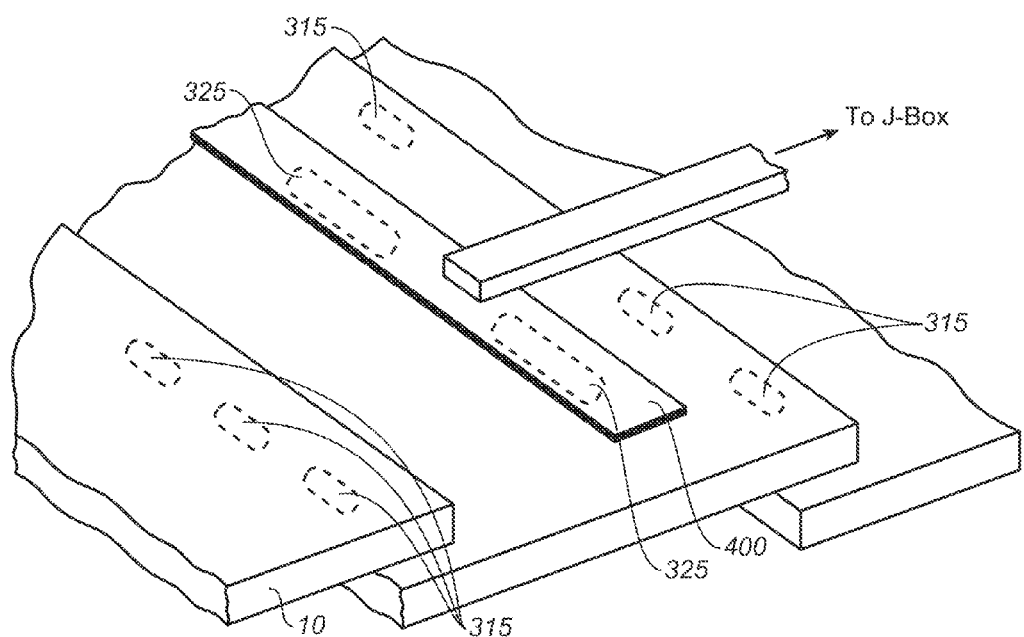

For example, FIG. 4 shows a first hidden tap interconnect 400 running substantially the full width of a solar cell 10 in a first super cell 100 and conductively bonded to hidden tap contact pads 325 arranged as shown in FIG. 3B, and a second hidden tap interconnect 400 running the full width of a corresponding solar cell in a super cell 100 in an adjacent row and similarly conductively bonded to hidden tap contact pads 325 arranged as shown in FIG. 3B. The two interconnects 400 are arranged in line with and optionally abutting or overlapping each other, and may be conductively bonded to each other or otherwise electrically connected to form a bus interconnecting the two adjacent super cells. This scheme may be extended across additional rows (e.g., all rows) of super cells as desired to form a parallel segment of a solar module comprising segments of several adjacent super cells. FIG. 5 shows a perspective view of a portion of a super cell from FIG. 4.

FIG. 8 shows an example in which super cells in adjacent rows are interconnected by a short interconnect 400 that spans the gap between the super cells and is conductively bonded to a hidden tap contact pad 320 on one super cell and to another hidden tap contact pad 320 on the other super cell, with the contact pads arranged as shown in FIG. 3A. FIG. 9 shows a similar arrangement in which a short interconnect spans the gap between two super cells in adjacent rows and is conductively bonded to the end of a central copper bus portion of the back surface metallization on one super cell and to an adjacent end of a central copper bus portion of the back surface metallization of the other super cell, with the copper back surface metallization configured as shown in FIG. 3C. In both examples the interconnection schemes may be extended across additional rows (e.g., all rows) of super cells as desired to form a parallel segment of a solar module comprising segments of several adjacent super cells.

FIGS. 10A-1 to 10E-3 show in plane (x-y) and out-of-plane (x-z) views of example short hidden tap interconnects 400 comprising in-plane stress relieving features 405. (The x-y plane is the plane of the solar cell back surface metallization pattern). In the examples of FIGS. 10A-1 to 10E-2 each interconnect 400 comprises tabs 400A and 400B positioned on opposite sides of one or more in-plane stress-relieving features. Example in-plane stress relieving features include arrangements of one, two, or more hollow diamond shapes, zig-zags, and arrangements of one, two, or more slots.

The term "in plane stress relieving feature" as used herein can also refer to the thickness or ductility of the interconnect or of a portion of the interconnect. For example, interconnect 400 shown in FIGS. 10E-1 to 10E-3 is formed from a straight flat length of thin copper ribbon or copper foil having a thickness T in the x-y plane of, for example, less than or equal to about 100 microns, less than or equal to about 50 microns, less than or equal to about 30 microns, or less than or equal to about 25 microns to increase the flexibility of the interconnect. The thickness T may be, for example, about 50 microns. The length L of the interconnect may be, for example, about 8 centimeters (cm) and the width W of the interconnect may be, for example, about 0.5 cm. FIGS. 10E-3 and 10E-1 show, respectively, front and rear surface views of the interconnect in the x-y plane. The front surface of the interconnect faces the rear surface of the solar module. Because the interconnect may span the gap between two parallel rows of super cells in a solar module, a portion of the interconnect may be visible through that gap from the front of the solar module. Optionally, that visible portion of the interconnect may be blackened, e.g. coated with a black polymer layer, to reduce its visibility. In the illustrated example, a central portion 400C of the front surface of the interconnect having a length L2 of about 0.5 cm is coated with a thin black polymer layer. Typically, L2 is greater than or equal to the width of the gap between super cell rows. The black polymer layer may have a thickness of, for example, about 20 microns. Such a thin copper ribbon interconnect may optionally also employ in-plane or out-of-plane stress relieving features as described above. For example, the interconnect may include stress-relieving out-of-plane bends as described above with respect to FIGS. 7B-1 and 7B-2.

FIGS. 11A-1 to 11B-2 show in plane (x-y) and out-of-plane (x-z) views of example short hidden tap interconnects 400 comprising out-of-plane stress relieving features 407. In the examples each interconnect 400 comprises tabs 400A and 400B positioned on opposite sides of one or more out-of-plane stress-relieving features. Example out-of-plane stress relieving features include arrangements of one, two, or more bends, kinks, dimples, jogs, or ridges.

The types and arrangements of stress relieving features illustrated in FIGS. 10A-1 to 10E-2 and 11A-1 to 11B-2, and the interconnect ribbon thicknesses described above with respect to FIGS. 10E-1 to 10E-3, may also be employed in long hidden tap interconnects as described above and in interconnects bonded to super cell rear or front surface terminal contacts, as suitable. An interconnect may comprise both in-plane and out-of plane stress relieving features in combination. The in-plane and out-of-plane stress relieving features are designed to reduce or minimize strain and stress effects on the solar cell joint and thereby create highly reliable and resilient electrical connections.

FIGS. 12A-1 and 12A-2 show example configurations for short hidden tap interconnects comprising cell contact pad alignment and super cell edge alignment features to facilitate automation, ease of manufacturing and placement accuracy. FIGS. 12B-1 and 12B-2 show an example configuration for short hidden tap interconnects that comprise asymmetric tab lengths. Such asymmetric interconnects may be used in opposite orientations to avoid overlap of conductors running parallel to the long axis of the super cells. (See discussion of FIGS. 15A-15B below).

Hidden taps as described herein may form the electrical connections needed in module layout to provide a desired module electrical circuit. Hidden tap connections may be made, for example, at intervals of 12, 24, 36, or 48 solar cells along a super cell, or at any other suitable interval. The interval between hidden taps may be determined based on the application.

Each super cell typically comprises a front surface terminal contact at one end of the super cell and a rear surface terminal contact at the other end of the super cell. In variations in which a super cell spans the length or width of the solar module, these terminal contacts are located adjacent to opposite edges of the solar module.

Figure 6A:
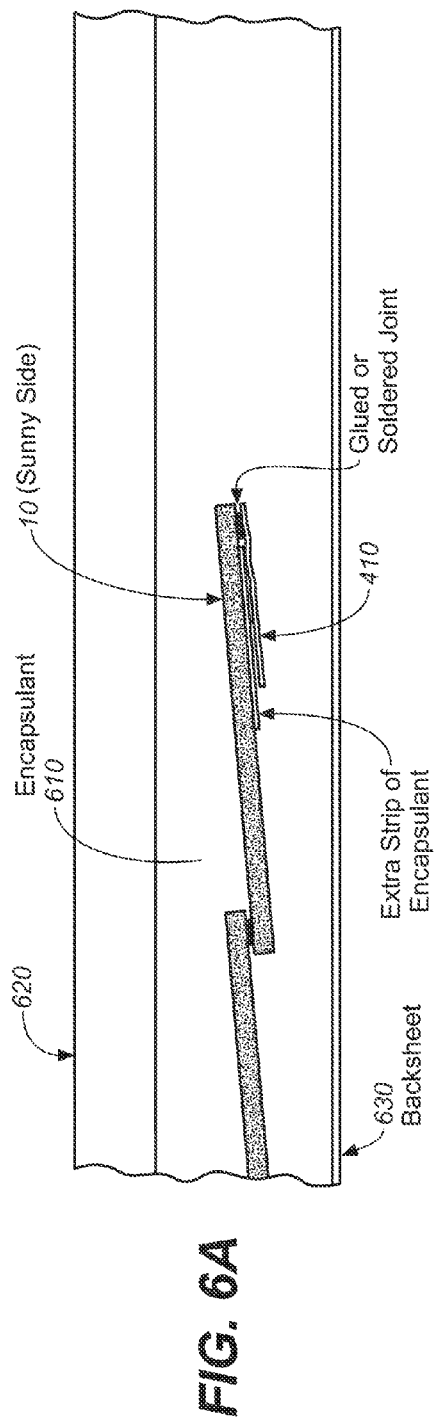
FIGS. 6A-6C show examples of interconnects bonded to super cell rear surface (FIG. 6A) and front surface (FIGS. 6B-6C) terminal contacts.

A flexible interconnect may be conductively bonded to a front or rear surface terminal contact of a super cell to electrically connect the super cell to other solar cells or to other electrical components in the module. For example, FIG. 6A shows a cross-sectional view of an example solar module with an interconnect 410 conductively bonded to a rear surface terminal contact at the end of a super cell. Rear surface terminal contact interconnect 410 may be or comprise, for example, a thin copper ribbon or foil having a thickness perpendicular to the surface of the solar cell to which it is bonded of less than or equal to about 100 microns, less than or equal to about 50 microns, less than or equal to about 30 microns, or less than or equal to about 25 microns to increase the flexibility of the interconnect. The interconnect may have a width of, for example, greater than or equal to about 10 mm in the plane of the surface of the solar cell in a direction perpendicular to the flow of current though the interconnect to improve conduction. As illustrated, a rear surface terminal contact interconnect 410 may lie behind the solar cells, with no portion of the interconnect extending beyond the super cell in the direction parallel to the super cell row.

Figure 6B:
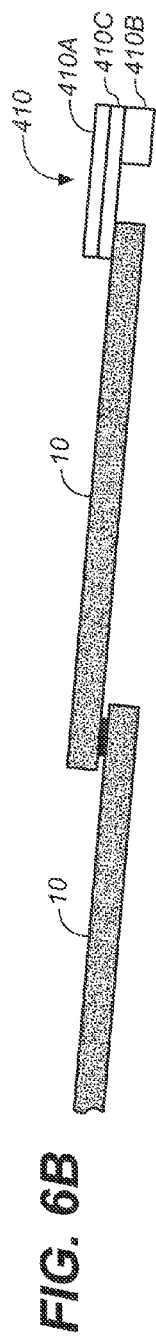
Figure 6C:
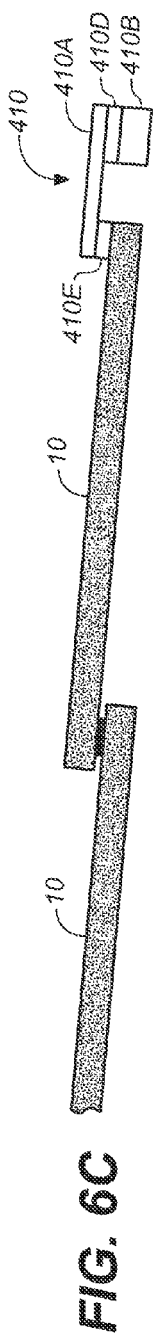
Figure 7A:
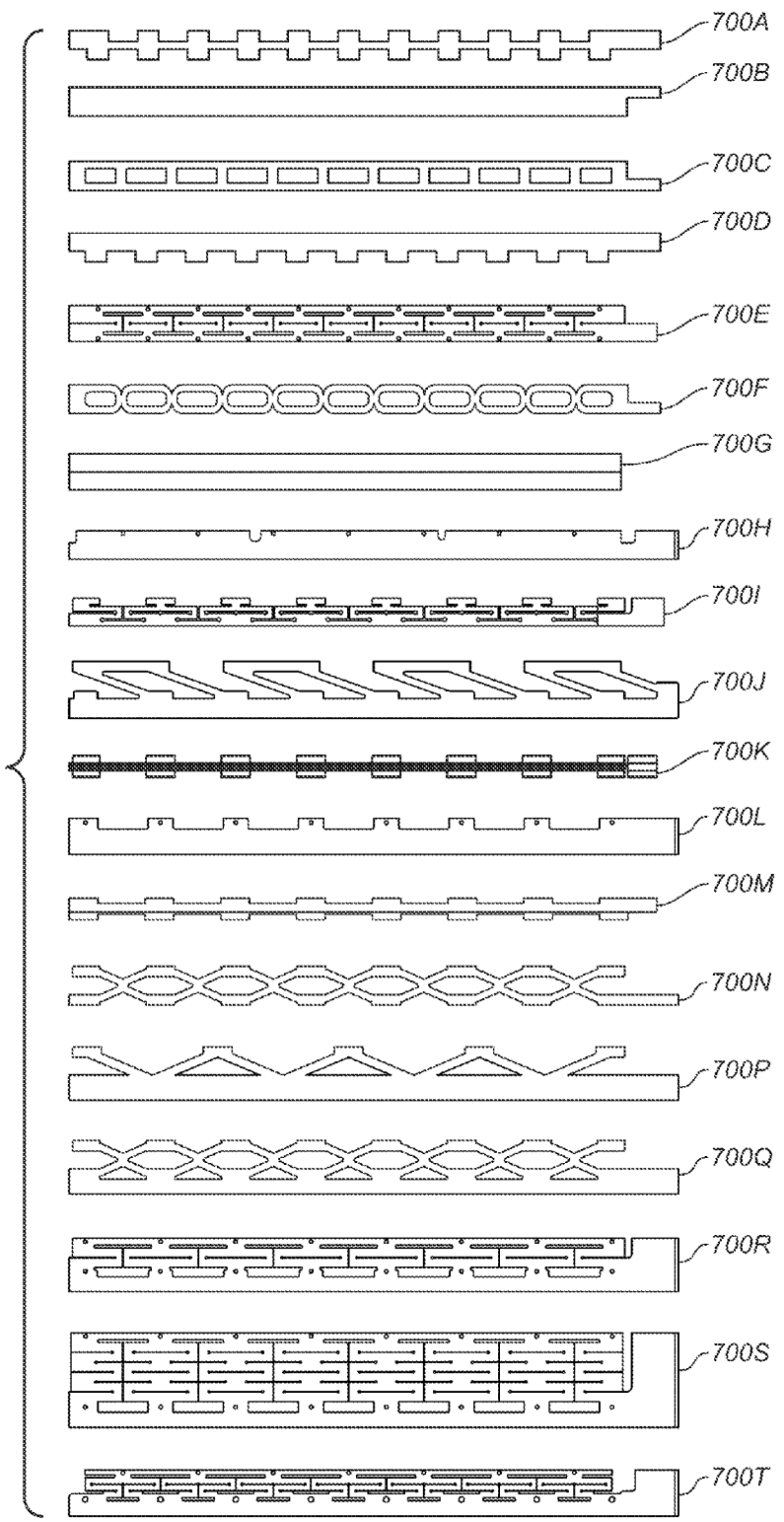
FIG. 7A shows example stress-relieving long interconnect configurations that may be used in hidden taps to super cells as described herein or as interconnects to front or rear surface super cell terminal contacts.

Similar interconnects may be used to connect to front surface terminal contacts. Alternatively, to reduce the area of the front surface of the solar module occupied by front surface terminal interconnects, a front surface interconnect may comprise a thin flexible portion directly bonded to the super cell and a thicker portion providing a higher conductivity. This arrangement reduces the width of the interconnect necessary to achieve a desired conductivity. The thicker portion of the interconnect may be an integral portion of the interconnect, for example, or may be a separate piece bonded to the thinner portion of the interconnect. For example, FIGS. 6B-6C each show a cross-sectional view of an example interconnect 410 conductively bonded to a front surface terminal contact at an end of a super cell. In both examples a thin flexible portion 410A of the interconnect directly bonded to the super cell comprises a thin copper ribbon or foil having a thickness perpendicular to the surface of the solar cell to which it is bonded of less than or equal to about 100 microns, less than or equal to about 50 microns, less than or equal to about 30 microns, or less than or equal to about 25. A thicker copper ribbon portion 410B of the interconnect is bonded to thin portion 410A to improve the conductivity of the interconnect. In FIG. 6B, an electrically conductive tape 410C on the rear surface of thin interconnect portion 410A bonds the thin interconnect portion to the super cell and to thick interconnect portion 410B. In FIG. 6C, thin interconnect portion 410A is bonded to thick interconnect portion 410B with an electrically conductive adhesive 410D and bonded to the super cell with an electrically conductive adhesive 410E. Electrically conductive adhesives 410D and 410E may be the same or different. Electrically conductive adhesive 410E may be, for example, a solder.

Solar modules described in this specification may comprise a laminate structure as shown in FIG. 6A, with super cells and one or more encapsulant materials 610 sandwiched between a transparent front sheet 620 and a back sheet 630. The transparent front sheet may be glass, for example. The back sheet may also be glass, or any other suitable material. An extra strip of encapsulant may be disposed between a rear surface terminal interconnect 410 and the rear surface of the super cell, as illustrated.

As noted above, hidden taps afford an "all black" module aesthetic. Because these connections are made with conductors that are typically highly reflective, they would normally be of high contrast to the attached solar cells. However, by forming the connections on the back surface of the solar cells and by also routing other conductors in the solar module circuit behind the solar cells the various conductors are hidden from view. This allows multiple connection points (hidden taps) while still maintaining the "all black" appearance.

Hidden taps can be used to form various module layouts. In the example of FIG. 13 (physical layout) and FIG. 14 (electrical schematic), a solar module comprises six super cells each of which run the length of the module. Hidden tap contact pads and short interconnects 400 segment each super cell into thirds and electrically connect adjacent super cell segments in parallel, thereby forming three groups of parallel connected super cell segments. Each group is connected in parallel with a different one of bypass diodes 1300A-1300B incorporated into (embedded in) the module's laminate construction. The bypass diodes may be located, for example, directly behind super cells or between super cells. The bypass diodes may be located approximately along a center line of the solar module parallel to the long sides of the solar module, for example.

In the example of FIGS. 15A-15B (also corresponding to the electrical schematic of FIG. 14), a solar module comprises six super cells each of which run the length of the module. Hidden tap contact pads and short interconnects 400 segment each super cell into thirds and electrically connect adjacent super cell segments in parallel, thereby forming three groups of parallel connected super cell segments. Each group is connected in parallel with a different one of bypass diodes 1300A-1300C through bus connections 1500A-1500C, which are located behind the super cells and connect the hidden tap contact pads and short interconnects to the bypass diodes located in the back of the module within a junction box.

FIG. 15B provides a detailed view of the connection of short hidden tap interconnects 400 and conductors 1500B and 1500C. As depicted these conductors do not overlap each other. In the illustrated example this is enabled by the use of asymmetric interconnects 400 arranged in opposite orientations. An alternative approach to avoiding overlap of the conductors is to employ a first symmetric interconnect 400 having tabs of one length and a second symmetric interconnect 400 having tabs of a different length.

Figure 16:
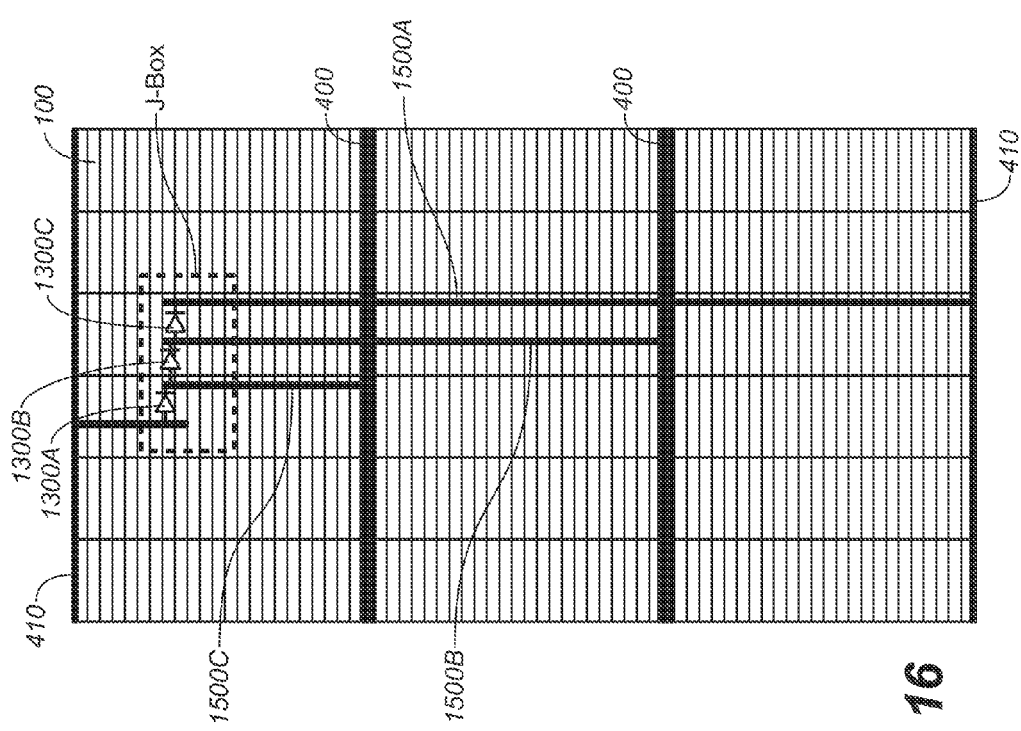

In the example of FIG. 16 (also corresponding to the electrical schematic of FIG. 14), a solar module is configured similarly to as shown in FIG. 15A except that hidden tap interconnects 400 form continuous buses that run substantially the full width of the solar module. Each bus may be a single long interconnect 400 conductively bonded to the back surface metallization of each super cell. Alternatively, the bus may comprise multiple individual interconnects, each spanning a single super cell, conductively bonded to each other or otherwise electrically interconnected as described above with respect to FIG. 4. FIG. 16 also shows super cell terminal interconnects 410 forming a continuous bus along one end of the solar module to electrically connect the front surface terminal contacts of the super cells, and additional super cell terminal interconnects 410 forming a continuous bus along the opposite end of the solar module to electrically connect the rear surface terminal contacts of the super cells.

The example solar module of FIGS. 17A-17B also corresponds to the electrical schematic of FIG. 14. This example employs short hidden tap interconnects 400 as in FIG. 15A and interconnects 410 forming continuous buses for the super cell front and rear surface terminal contacts, as in FIG. 16.

Figure 20B:
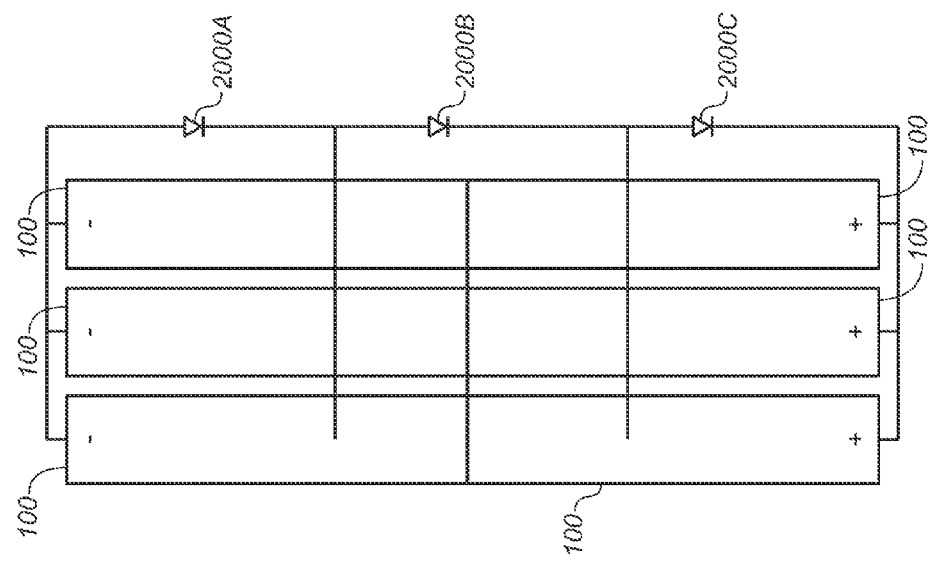
FIGS. 20A-20B show, respectively, another example solar module layout employing hidden taps and the corresponding electrical schematic.
Figure 20A:
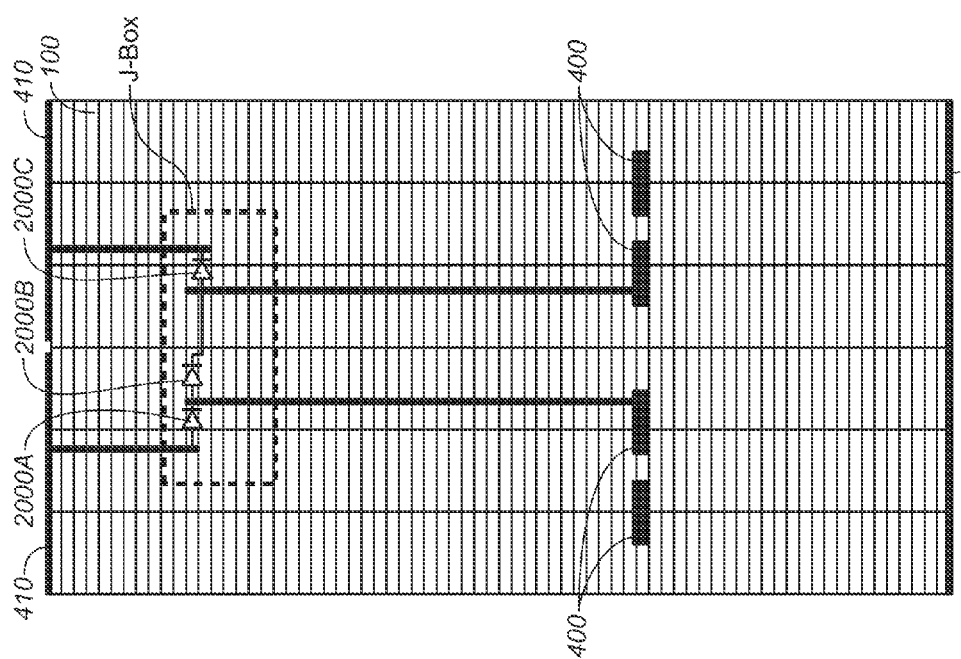

In the example of FIG. 20A (physical layout) and FIG. 20B (electrical schematic), a solar module comprises six super cells each of which run the full length of the solar module. Hidden tap contact pads and short interconnects 400 segment each super cell into a ⅔ length section and a ⅓ length section. Interconnects 410 at the lower edge of the solar module (as depicted in the drawing) interconnect the left hand three rows in parallel with each other, the right hand three rows in parallel with each other, and the left hand three rows in series with the right hand three rows. This arrangement forms three groups of parallel connected super cell segments with each super cell group having a length of ⅔ the length of a super cell. Each group is connected in parallel with a different one of bypass diodes 2000A-2000C. This arrangement provides about twice the voltage and about half of the current that would be provided by the same super cells if they were instead electrically connected as shown in FIG. 14.

As noted above with reference to FIG. 6, interconnects bonded to super cell rear surface terminal contacts may lie entirely behind the super cells and be hidden from view from the front (sun) side of the solar module. Interconnects 410 bonded to super cell front surface terminal contacts may be visible in a rear view of the solar module (e.g., as in FIG. 16) because they extend beyond the ends of the super cells (e.g., as in FIG. 17A) or because they fold around and under the ends of the super cells.

The use of hidden taps facilitates grouping small numbers of solar cells per bypass diode. In the examples of FIGS. 21A-21B (each showing a physical layout), a solar module comprises six super cells each of which run the length of the module. Hidden tap contact pads and short interconnects 400 segment each super cell into fifths and electrically connect adjacent super cell segments in parallel, thereby forming five groups of parallel connected super cell segments. Each group is connected in parallel with a different one of bypass diodes 2100A-2100E incorporated into (embedded in) the module's laminate construction. The bypass diodes may be located, for example, directly behind super cells or between super cells. Super cell terminal interconnects 410 form a continuous bus along one end of the solar module to electrically connect the front surface terminal contacts of the super cells, and additional super cell terminal interconnects 410 form a continuous bus along the opposite end of the solar module to electrically connect the rear surface terminal contacts of the super cells. In the example of FIG. 21A, a single junction box 2110 is electrically connected to the front and rear surface terminal interconnect buses by conductors 2115A and 2115B. There are no diodes in the junction box, however, so alternatively (FIG. 21B) the long return conductors 2215A and 2115B can be eliminated and the single junction box 2110 replaced with two single polarity (+ or −) junction boxes 2110A-2110B located, for example, at opposite edges of the module. This eliminates resistive loss in the long return conductors.

Although the examples described herein use hidden taps to electrically segment each supercell into three or five groups of solar cells, these examples are intended to be illustrative but not limiting. More generally, hidden taps may be used to electrically segment a super cell into more or fewer groups of solar cells then illustrated, and/or into more or fewer solar cells per group then illustrated.

Figure 18:
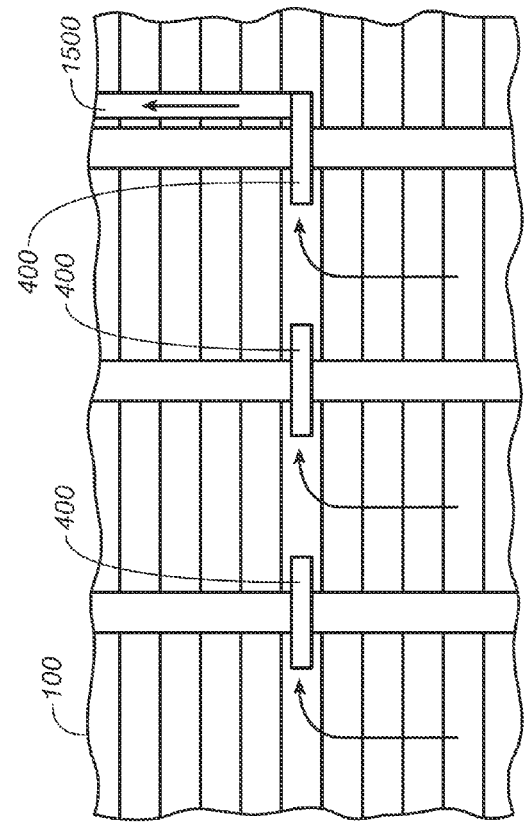
FIG. 18 shows current flow in an example solar module with a bypass diode in conduction.

In normal operation of the solar modules described herein, with no bypass diode forward biased and in conduction, little or no current flows through any hidden tap contact pad. Instead, current flows through the length of each super cell through the cell-to-cell conductive bonds formed between adjacent overlapping solar cells. In contrast, FIG. 18 shows current flow when a portion of the solar module is bypassed through a forward biased bypass diode. As indicated by the arrows, in this example current in the leftmost super cell flows along the super cell until it reaches the tapped solar cell, then through that solar cell's back surface metallization, a hidden tap contact pad (not shown), an interconnect 400 to a second solar cell in the adjacent super cell, another hidden tap contact pad (not shown) to which the interconnect is bonded on the second solar cell, through the back surface metallization of the second solar cell, and through additional hidden tap contact pads, interconnects, and solar cell back surface metallization to reach bus connection 1500 to the bypass diode. Current flow through the other super cells is similar. As is apparent from the illustration, under such circumstances hidden tap contact pads may conduct current from two or more rows of super cells, and thus conduct a current greater than the current generated in any single solar cell in the module.

Typically there is no bus bar, contact pad, or other light blocking element (other than front surface metallization fingers or an overlapping portion of an adjacent solar cell) on the front surface of a solar cell opposite from a hidden tap contact pad. Consequently, if the hidden tap contact pad is formed from silver on a silicon solar cell, the light conversion efficiency of the solar cell in the region of the hidden tap contact pad may be reduced if the silver contact pad reduces the effect of a back surface field that prevents back surface carrier recombination. In order to avoid this loss of efficiency, typically most of the solar cells in a super cell do not comprise hidden tap contact pads. (For example, in some variations only those solar cells for which a hidden tap contact pad is necessary for a bypass diode circuit will comprise such a hidden tap contact pad). Further, to match the current generation in solar cells that include hidden tap contact pads to the current generation in solar cells that lack hidden tap contact pads, the solar cells comprising hidden tap contact pads may have a larger light collection area than the solar cells lacking hidden tap contact pads.

Individual hidden tap contact pads may have rectangular dimensions of, for example, less than or equal to about 2 mm by less than or equal to about 5 mm.

Figure 19A:
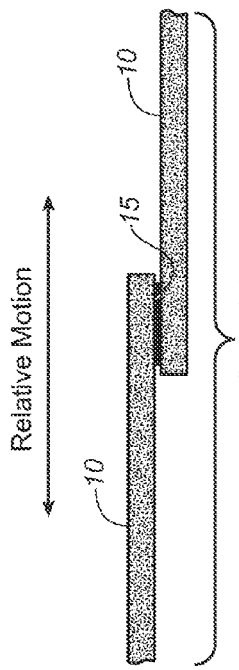
FIGS. 19A-19B show relative motion between solar module components resulting from thermal cycling in, respectively, a direction parallel to the rows of super cells and a direction perpendicular to the rows of super cells in the solar module.
Figure 19B:
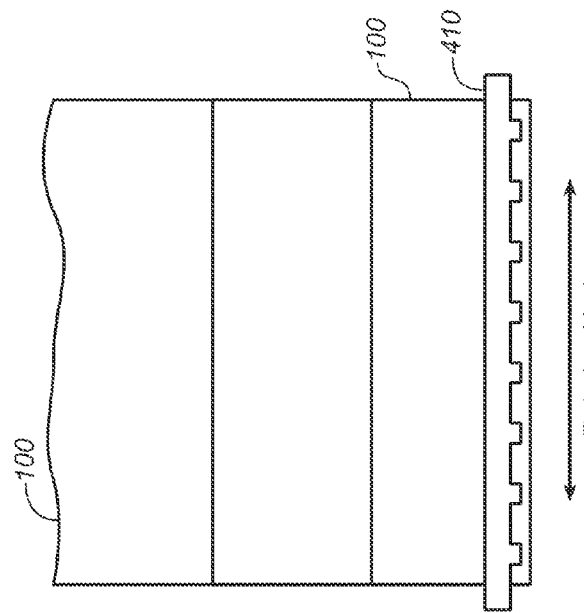

Solar modules are subject to temperature cycling as a result of temperature variations in their installed environment, during operation, and during testing. As shown in FIG. 19A, during such temperature cycling a mismatch in thermal expansion between the silicon solar cells in the super cell and other portions of the module, for example a glass front sheet of the module, results in relative motion between the super cell and the other portions of the module along the long axis of the super cell rows. This mismatch tends to stretch or compress the super cells, and may damage the solar cells or the conductive bonds between solar cells in the super cells. Similarly, as shown in FIG. 19B, during temperature cycling a mismatch in thermal expansion between an interconnect bonded to a solar cell and the solar cell results in relative motion between the interconnect and the solar cell in the direction perpendicular to the rows of super cells. This mismatch strains and may damage the solar cells, the interconnect, and the conductive bond between them. This may occur for interconnects bonded to hidden tap contact pads and for interconnects bonded to super cell front or rear surface terminal contacts.

Similarly, cyclical mechanical loading of a solar module, for example during shipping or from weather (e.g. wind and snow), can create local shear forces at the cell-to-cell bonds within a super cell and at the bond between a solar cell and an interconnect. These shear forces can also damage the solar module.

To prevent problems arising from relative motion between the super cells and other portions of the solar module along the long axis of the super cell rows, the conductive adhesive used to bond adjacent overlapping solar cells to each other may be selected to form a flexible conductive bond 15 (FIG. 19A) between overlapping solar cells that provides mechanical compliance to the super cells accommodating a mismatch in thermal expansion between the super cells and a glass front sheet of the module in a direction parallel to the rows for a temperature range of about −40° C. to about 100° C. without damaging the solar module. The conductive adhesive may be selected to form conductive bonds having a shear modulus at standard test conditions (i.e., 25° C.) of, for example, less than or equal to about 100 megapascals (MPa), less than or equal to about 200 MPa, less than or equal to about 300 MPa, less than or equal to about 400 MPa, less than or equal to about 500 MPa, less than or equal to about 600 MPa, less than or equal to about 700 MPa, less than or equal to about 800 MPa, less than or equal to about 900 MPa, or less than or equal to about 1000 MPa. The flexible conductive bonds between overlapping adjacent solar cells may accommodate differential motion between each cell and the glass front sheet of greater than or equal to about 15 microns, for example. Suitable conductive adhesives may include, for example, ECM 1541-S3 available from Engineered Conductive Materials LLC.

To promote the flow of heat along a super cell, which reduces the risk of damage to the solar module from hot spots that may arise during operation of the solar module if a solar cell in the module is reverse biased as a resulting of shading or for some other reason, conductive bonds between overlapping adjacent solar cells may be formed with, for example, a thickness perpendicular to the solar cells of less than or equal to about 50 microns and a thermal conductivity perpendicular to the solar cells greater than or equal to about 1.5 W/(meter-K).

To prevent problems arising from relative motion between an interconnect and a solar cell to which it is bonded, the conductive adhesive used to bond the interconnect to the solar cell may be selected to form a conductive bond between the solar cell and the interconnect that is sufficiently stiff to force the interconnect to accommodate a mismatch in thermal expansion between the solar cell and the interconnect for a temperature range of about −40° C. to about 180° C. without damaging the solar module. This conductive adhesive may be selected to form a conductive bond having a shear modulus at standard test conditions (i.e., 25° C.) of, for example, greater than or equal to about 1800 MPa, greater than or equal to about 1900 MPa, greater than or equal to about 2000 MPa, greater than or equal to about 2100 MPa, greater than or equal to about 2200 MPa, greater than or equal to about 2300 MPa, greater than or equal to about 2400 MPa, greater than or equal to about 2500 MPa, greater than or equal to about 2600 MPa, greater than or equal to about 2700 MPa, greater than or equal to about 2800 MPa, greater than or equal to about 2900 MPa, greater than or equal to about 3000 MPa, greater than or equal to about 3100 MPa greater than or equal to about 3200 MPa, greater than or equal to about 3300 MPa, greater than or equal to about 3400 MPa, greater than or equal to about 3500 MPa, greater than or equal to about 3600 MPa, greater than or equal to about 3700 MPa, greater than or equal to about 3800 MPa, greater than or equal to about 3900 MPa, or greater than or equal to about 4000 MPa. In such variations the interconnect may withstand thermal expansion or contraction of the interconnect of greater than or equal to about 40 microns, for example. Suitable conductive adhesives may include, for example, Hitachi CP-450 and solders.

Hence, the conductive bonds between overlapping adjacent solar cells within a super cell may utilize a different conductive adhesive than the conductive bonds between the super cell and the flexible electrical interconnect. For example, the conductive bond between the super cell and the flexible electrical interconnect may be formed from a solder, and the conductive bonds between overlapping adjacent solar cells formed from a non-solder conductive adhesive. In some variations, both conductive adhesives can be cured in a single process step, for example in an about 150° C. to about 180° C. process window.

The above discussion has focused upon assembling a plurality of solar cells (which may be cut solar cells) in a shingled manner on a common substrate. This results in the formation of a module.

In order to gather a sufficient amount of solar energy to be useful, however, an installation typically comprises a number of such modules that are themselves assembled together. According to embodiments, a plurality of solar cell modules may also be assembled in a shingled manner to increase the area efficiency of an array.

In particular embodiments, a module may feature a top conductive ribbon facing a direction of solar energy, and a bottom conductive ribbon facing away from the direction of solar energy.

The bottom ribbon is buried beneath the cells. Thus, it does not block incoming light and adversely impact an area efficiency of the module. By contrast, the top ribbon is exposed and can block the incoming light and adversely impact efficiency.

According to embodiments the modules themselves can be shingled, such that the top ribbon is covered by the neighboring module. This shingled module configuration could also provide for additional area on the module for other elements, without adversely impacting a final exposed area of the module array. Examples of module elements that may be positioned in overlapping regions can include but are not limited to, junction boxes (j-boxes) and/or bus ribbons.

In certain embodiments, j-boxes of the respective adjacent shingled modules and are in a mating arrangement in order to achieve electrical connection between them. This simplifies the configuration of the array of shingled modules by eliminating wiring.

In certain embodiments, the j-boxes could be reinforced and/or combined with additional structural standoffs. Such a configuration could create an integrated tilted module roof mount rack solution, wherein a dimension of the junction box determines a tilt. Such an implementation may be particularly useful where an array of shingled modules is mounted on a flat roof.

Shingled super cells open up unique opportunities for module layout with respect to module level power management devices (for example, DC/AC micro-inverters, DC/DC module power optimizers, voltage intelligence and smart switches, and related devices). A feature of module level power management systems is power optimization. Super cells as described and employed herein may produce higher voltages than traditional panels. In addition, super cell module layout may further partition the module. Both higher voltages and increased partitioning create potential advantages for power optimization.

This disclosure is illustrative and not limiting. Further modifications will be apparent to one skilled in the art in light of this disclosure and are intended to fall within the scope of the appended claims.

What is claimed is:

1. A solar module comprising:
a plurality of super cells arranged in two or more parallel rows, each super cell comprising a plurality of rectangular or substantially rectangular silicon solar cells arranged in line with long sides of adjacent silicon solar cells overlapping and conductively bonded directly to each other to electrically connect the silicon solar cells in series;
a first solar cell located at an intermediate position along a first one of the super cells in a first one of the rows of super cells;
a hidden tap contact pad located on a back surface of the first solar cell; and
a second solar cell in the first super cell, the second solar cell not having a hidden tap contact pad on its back surface;
wherein the hidden tap contact pad on the back surface of the first solar cell is electrically connected to least a third solar cell located in a second one of the rows of super cells;
wherein the hidden tap contact pad on the back surface of the first solar cell does not conduct current if all solar cells in the solar module are operating normally;
wherein no portion of the front surface of the first solar cell overlying the hidden tap contact pad on the back surface of the first solar cell is occupied by contact pads or any other interconnect features; and
wherein the first solar cell has a larger light collection area than does the second solar cell, the larger light collection area of the first solar cell compensating for reduced light conversion efficiency of the first solar cell in the region of the first solar cell overlying the hidden tap contact pad and thereby matching current generated in the first solar cell to current generated in the second solar cell.

2. The solar module of claim 1, comprising an electrical interconnect bonded to the hidden tap contact pad and electrically interconnecting the hidden tap contact pad to the third solar cell, wherein the electrical interconnect does not substantially span the length of the first solar cell and a back surface metallization pattern on the first solar cell provides a conductivity path to the hidden tap contact pad having a sheet resistance less than or equal to about 5 Ohms per square.

3. The solar module of claim 1, wherein the plurality of super cells are arranged in three or more parallel rows spanning the width of the solar module perpendicular to the rows, and the hidden tap contact pad is electrically connected to a hidden contact pad on at least one solar cell in each of the rows of super cells to electrically connect the rows of super cells in parallel, and at least one bus connection to at least one of the hidden tap contact pads or to an interconnect between hidden tap contact pads connects to a bypass diode or other electronic device.

4. The solar module of claim 1, comprising a flexible electrical interconnect conductively bonded to the hidden tap contact pad to electrically connect it to the third solar cell, wherein:
the portion of the flexible electrical interconnect conductively bonded to the hidden tap contact pad is ribbon-like, formed from copper, and has a thickness perpendicular to the surface of the solar cell to which it is bonded of less than or equal to about 50 microns; and
the conductive bond between the hidden tap contact pad and the flexible electrical interconnect forces the flexible electrical interconnect to withstand a mismatch in thermal expansion between the first solar cell and the flexible interconnect, and to accommodate relative motion between the first solar cell and the second solar cell resulting from thermal expansion, for a temperature range of about −40° C. to about 180° C. without damaging the solar module.

5. The solar module of claim 1, wherein any area of the front surface of the first solar cell which is not overlapped by a portion of an adjacent solar cell in the first super cell is not occupied by contact pads or any other interconnect features.

6. The solar module of claim 1, wherein in each super cell most of the cells do not have hidden tap contact pads.

7. The solar module of claim 1, arranged with an end portion overlapping and electrically connected to an end portion of another solar module.

\* \* \* \* \*